United States Patent
Na et al.

(10) Patent No.: US 9,711,088 B2
(45) Date of Patent: Jul. 18, 2017

(54) DISPLAY DEVICE

(71) Applicant: LG DISPLAY CO., LTD., Seoul (KR)

(72) Inventors: Sehwan Na, Paju-si (KR); Joungmi Choi, Paju-si (KR); Dahye Shim, Seoul (KR); Daegyu Jo, Seoul (KR); Sohyun Kim, Paju-si (KR); Hyunguk Jang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 23 days.

(21) Appl. No.: 14/817,668

(22) Filed: Aug. 4, 2015

(65) Prior Publication Data

US 2016/0042691 A1 Feb. 11, 2016

(30) Foreign Application Priority Data

Aug. 5, 2014 (KR) .................. 10-2014-0100491

(51) Int. Cl.
  *G09G 3/36* (2006.01)
  *G09G 3/3258* (2016.01)
  *G09G 3/3266* (2016.01)
  *G11C 19/28* (2006.01)
  *G09G 3/3233* (2016.01)

(52) U.S. Cl.
  CPC ......... *G09G 3/3258* (2013.01); *G09G 3/3266* (2013.01); *G09G 3/3677* (2013.01); *G11C 19/28* (2013.01); *G09G 3/3233* (2013.01); *G09G 2300/0426* (2013.01); *G09G 2300/0842* (2013.01); *G09G 2300/0861* (2013.01); *G09G 2310/0286* (2013.01); *G09G 2310/08* (2013.01); *G09G 2320/041* (2013.01); *G09G 2330/04* (2013.01)

(58) Field of Classification Search
  CPC ......... G09G 3/3266; G09G 2300/0426; G09G 2310/08; G09G 3/3258; G09G 3/3233; G09G 2330/04; G09G 2300/0842; G09G 2300/0861; G09G 2310/0286; G09G 2320/041; G09G 3/3677; G11C 19/00
  See application file for complete search history.

(56) References Cited

U.S. PATENT DOCUMENTS

2006/0022305 A1* 2/2006 Yamashita ........... G09G 3/2014
  257/565

* cited by examiner

*Primary Examiner* — Charles Hicks
(74) *Attorney, Agent, or Firm* — Dentons US LLP

(57) ABSTRACT

A display device includes a display panel and a scan driver including transistors formed in a non-display area of the display panel. A compensation voltage is supplied to the scan driver through a compensation gate electrode included in at least one transistor of the scan driver. Namely, the at least one transistor includes a gate electrode, to which a signal or a voltage for activating a channel is supplied, and the compensation gate electrode, to which the compensation voltage for recovering a threshold voltage is supplied.

16 Claims, 16 Drawing Sheets

DISPLAY DEVICE

This application claims the benefit of Korean Patent Application No. 10-2014-0100491 filed on Aug. 5, 2014, which is incorporated herein by reference for all purposes as if fully set forth herein.

BACKGROUND OF THE INVENTION

Field of the Invention

Embodiments of the invention relate to a display device.

Description of the Related Art

The development of information technology has expanded the market of display devices used as a connection medium between users and information. Hence, the use of the display devices, such as an organic light emitting diode (OLED) display, a liquid crystal display (LCD), and a plasma display panel (PDP), is increasing.

Among the above-described display devices, for example, the liquid crystal display or the OLED display includes a display panel including a plurality of subpixels arranged in a matrix form and a driver for driving the display panel. The driver includes a scan driver supplying a scan signal (or a gate signal) to the display panel and a data driver supplying a data signal to the display panel.

When the scan signal and the data signal are supplied to the subpixels of the display device, the selected subpixels emit light and thus may display an image.

The scan driver outputting the scan signal is classified into an outer mounted scan driver mounted on an outer substrate of the display panel in an integrated circuit (IC) form and an embedded scan driver formed in the display panel in a gate-in panel (GIP) form when a thin film transistor is manufactured. However, it is difficult to secure the reliability of the related art embedded scan driver because of degradation factors, such as a temperature, a bias voltage, and a stress time, generating changes in a threshold voltage of the thin film transistor constituting a circuit. Thus, there is a need to improve the reliability of the embedded scan driver.

SUMMARY OF THE INVENTION

In one aspect, there is a display device comprising a display panel and a scan driver including transistors formed in a non-display area of the display panel, wherein a compensation voltage is supplied to the scan driver through a compensation gate electrode included in at least one transistor of the scan driver.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Exemplary embodiments of the invention will be described with reference to FIGS. 1 to 22.

Figure 1:
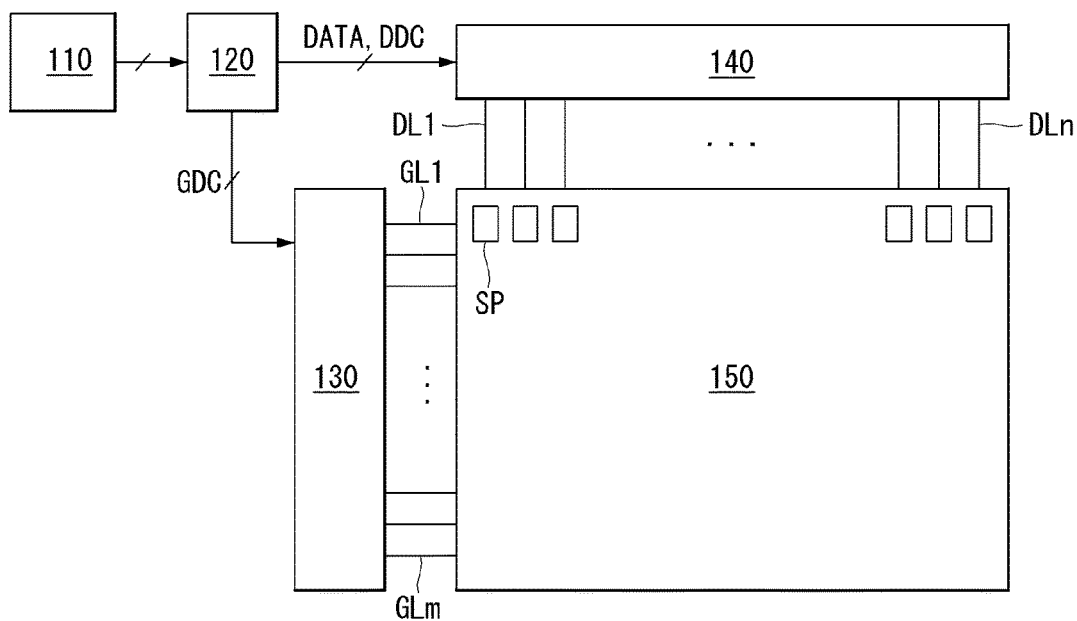
FIG. 1 is a block diagram schematically showing an organic light emitting diode (OLED) display according to an exemplary embodiment of the invention.
Figure 2:
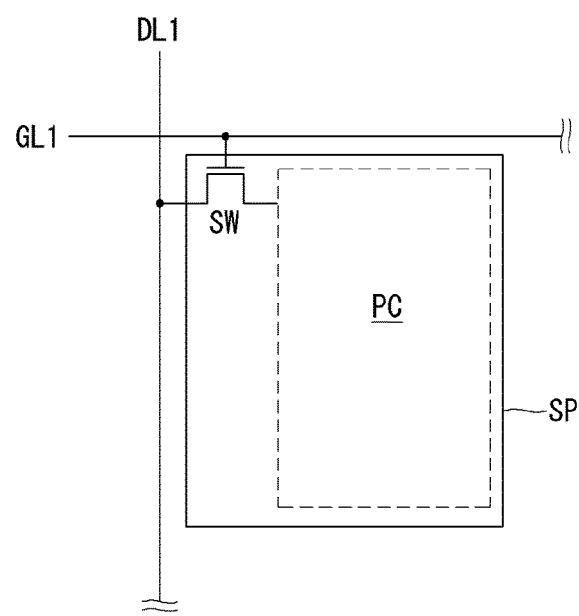
FIG. 2 schematically shows a configuration of a subpixel shown in FIG. 1.
Figure 3:
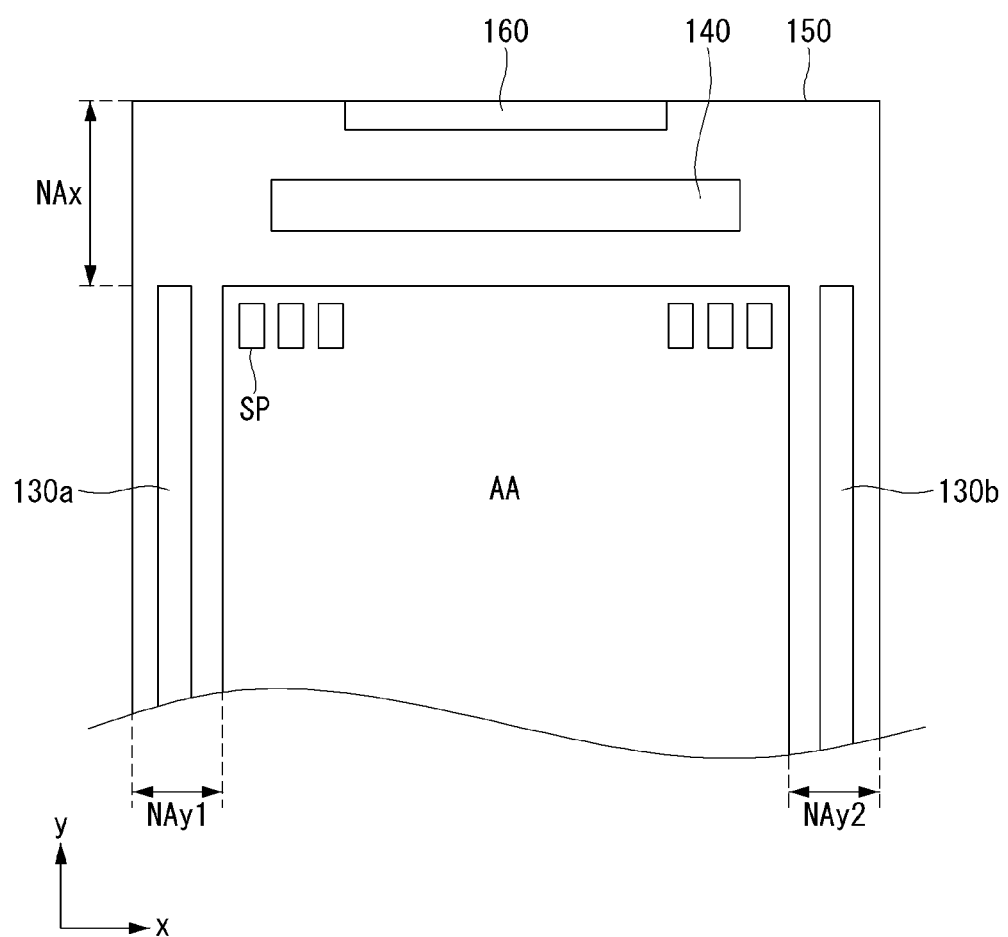
FIG. 3 is a plane diagram schematically showing a display panel shown in FIG. 1.

FIG. 1 is a block diagram schematically showing an organic light emitting diode (OLED) display according to an exemplary embodiment of the invention. FIG. 2 schematically shows a configuration of a subpixel shown in FIG. 1. FIG. 3 is a plane diagram schematically showing a display panel shown in FIG. 1.

As shown in FIG. 1, the OLED display according to the embodiment of the invention includes an image supply unit 110, a timing controller 120, a scan driver 130, a data driver 140, and a display panel 150.

The image supply unit 110 processes a data signal DATA and outputs the data signal DATA along with a vertical sync signal, a horizontal sync signal, a data enable signal, and a clock signal. The image supply unit 110 supplies the vertical sync signal, the horizontal sync signal, the data enable signal, the clock signal, and the data signal DATA to the timing controller 120.

The timing controller 120 receives the data signal DATA, etc. from the image supply unit 110 and outputs a gate timing control signal GDC for controlling operation timing of the scan driver 130 and a data timing control signal DDC for controlling operation timing of the data driver 140. The timing controller 120 supplies the data timing control signal DDC and the data signal DATA to the data driver 140.

The scan driver 130 outputs a scan signal while shifting a level of a gate voltage in response to the gate timing control signal GDC received from the timing controller 120.

The scan driver 130 includes a level shifter and a shift register. The scan driver 130 supplies the scan signal to subpixels SP of the display panel 150 through scan lines GL1 to GLm. The scan driver 130 is formed in the display panel 150 in a gate-in panel (GIP) manner.

The data driver 140 samples and latches the data signal DATA in response to the data timing control signal DDC received from the timing controller 120, converts a digital signal corresponding to a gamma reference voltage into an analog signal, and outputs the analog signal. The data driver 140 supplies the data signal DATA to the subpixels SP of the display panel 150 through data lines DL1 to DLn. The data driver 140 is formed in an integrated circuit (IC) form.

The display panel 150 displays an image corresponding to the scan signal supplied from the scan driver 130 and the data signal DATA supplied from the data driver 140. The display panel 150 includes the subpixels SP which emit light by themselves or control external light so as to display the image.

As shown in FIG. 2, one subpixel SP includes a switching thin film transistor (TFT) SW (or formed at a crossing of the scan line GL1 and the data line DL1) connected to the scan line GL1 and the data line DL1 and a pixel circuit PC driven in response to the data signal DATA supplied through the switching TFT SW. The subpixels SP constitute a liquid crystal display panel including a liquid crystal element or an organic light emitting diode (OLED) display panel including an organic light emitting element depending on configuration of the pixel circuit PC.

When the display panel 150 is configured as the OLED display panel, the display panel 150 may be implemented as a top emission type, a bottom emission type, or a dual emission type. When the display panel 150 may be configured as the liquid crystal display panel, the display panel 150 is implemented in a twisted nematic (TN) mode, a vertical alignment (VA) mode, an in-plane switching (IPS) mode, a fringe field switching (FFS) mode, or an electrically controlled birefringence (ECB) mode.

As shown in FIG. 3, the display panel 150 has a display area AA, and scan drivers 130a and 130b, the data driver 140, and signal pads 160 are formed on the display panel 150. Because the image supply unit 110 and the timing controller 120 described with reference to FIG. 1 are formed on an external substrate of the display panel 150, the image supply unit 110 and the timing controller 120 are not shown in FIG. 3 for the sake of brevity and ease of reading.

The subpixels SP are formed in the display area AA of the display panel 150. An area outside the display area AA is defined as a bezel area serving as non-display areas NAx, NAy1, and NAy2. The first and second non-display areas NAy1 and NAy2 are defined as side bezel areas, and the third non-display area NAx is defined as a lower bezel area (or an upper bezel area depending on a direction viewed). In the embodiment of the invention, the lower bezel area is used.

The scan drivers 130a and 130b are formed in the side bezel areas of the display panel 150. As shown in FIG. 3, the scan drivers 130a and 130b may be formed in the first and second non-display areas NAy1 and NAy2 on the left and right sides of the display area AA. The scan drivers 130a and 130b may be formed in both the first and second non-display areas NAy1 and NAy2 or may be formed in only one NAy1 or NAy2 of the first and second non-display areas NAy1 and NAy2 depending on a resolution or the size of the display panel 150.

The signal pads 160 are formed on the outermost side of the display panel 150 and include a plurality of pads. The signal pads 160 may be formed in an outermost portion positioned in the third non-display area NAx or may be formed in an outermost portion positioned in the first and second non-display areas NAy1 and NAy2 depending on the resolution or the size of the display panel 150.

The timing controller 120 and a power supply unit are generally mounted on an external substrate (for example, a printed circuit board) in an IC form. Thus, the signal pads 160 are a part connected to the external substrate, on which the timing controller 120, etc. are formed, and transmit or supply various signals or the power output from the external substrate to the display panel 150.

The data driver 140 may be formed in the third non-display area NAx positioned between the signal pads 160 of the display panel 150 and the display area AA. In this instance, the data driver 140 is configured in the IC form and is mounted on bump pads formed on the display panel 150. However, when the resolution or the size of the display panel 150 is large, the data driver 140 is not formed in the third non-display area NAx and is mounted on the external substrate of the display panel 150.

Hereinafter, a first embodiment of the invention is described using the OLED display panel as an example of the display panel 150.

First Embodiment

Figure 4:
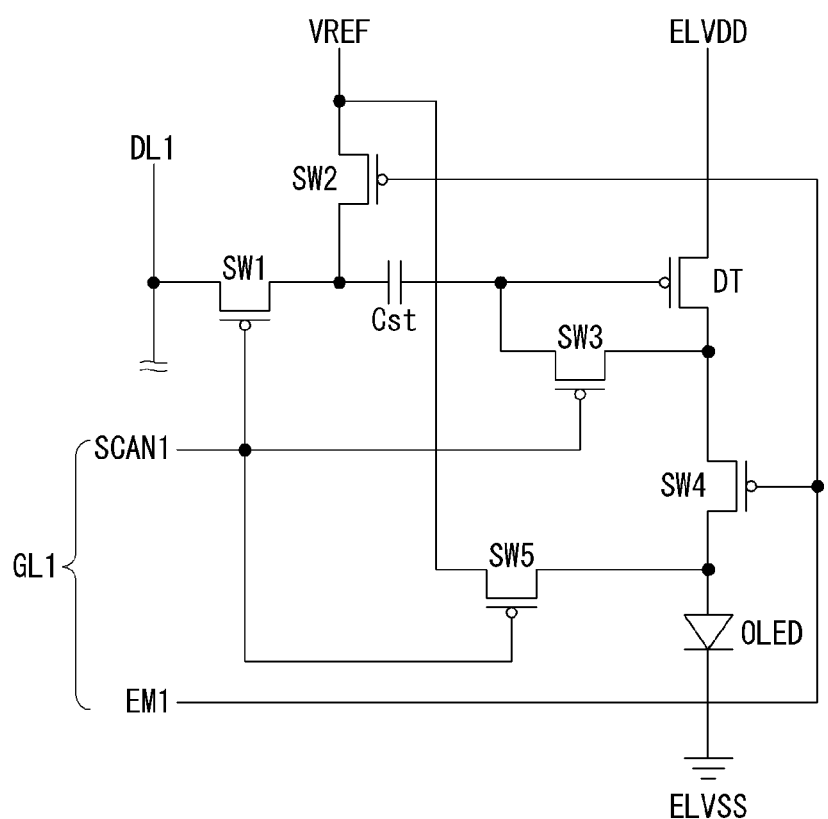
FIG. 4 shows a first example of circuit configuration of a subpixel.
Figure 5:
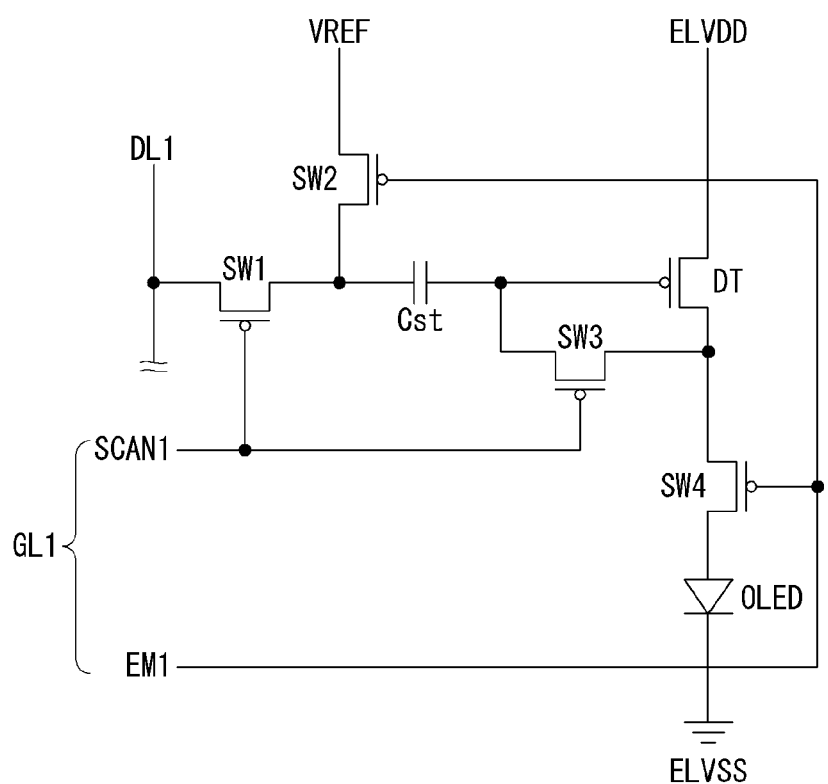
FIG. 5 shows a second example of circuit configuration of a subpixel.
Figure 6:
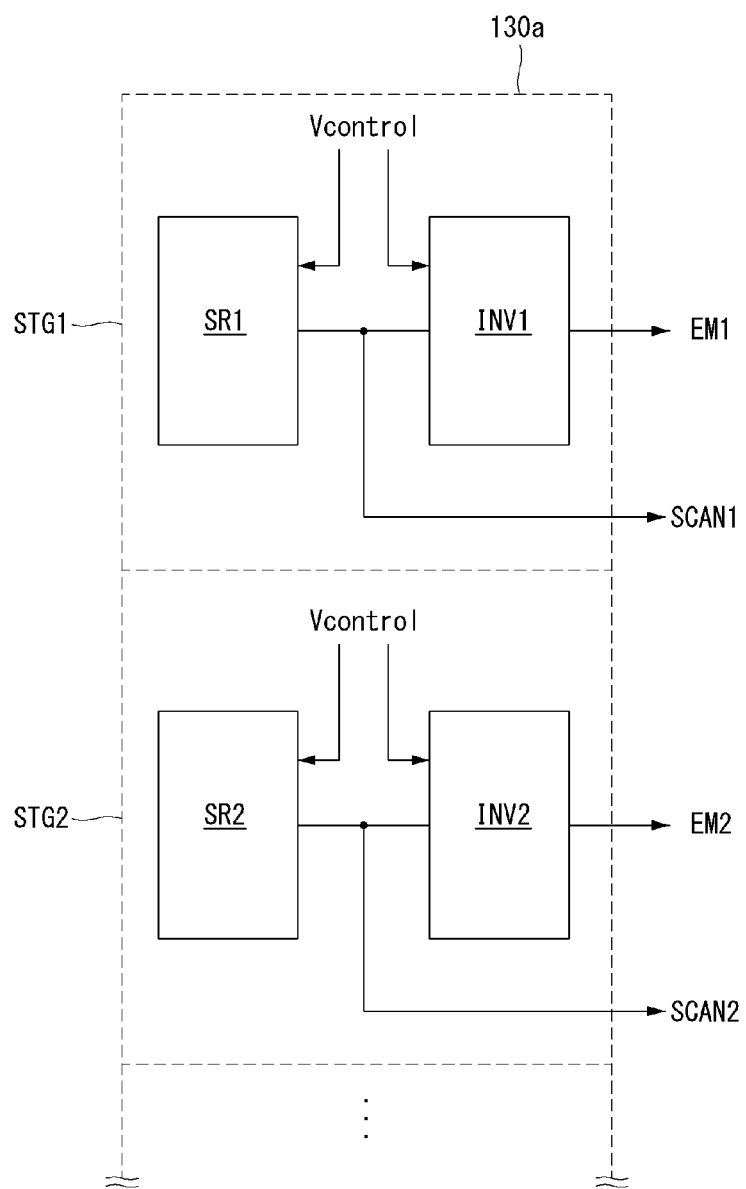
FIG. 6 is a block diagram partially showing a scan driver according to a first embodiment of the invention.
Figure 7:
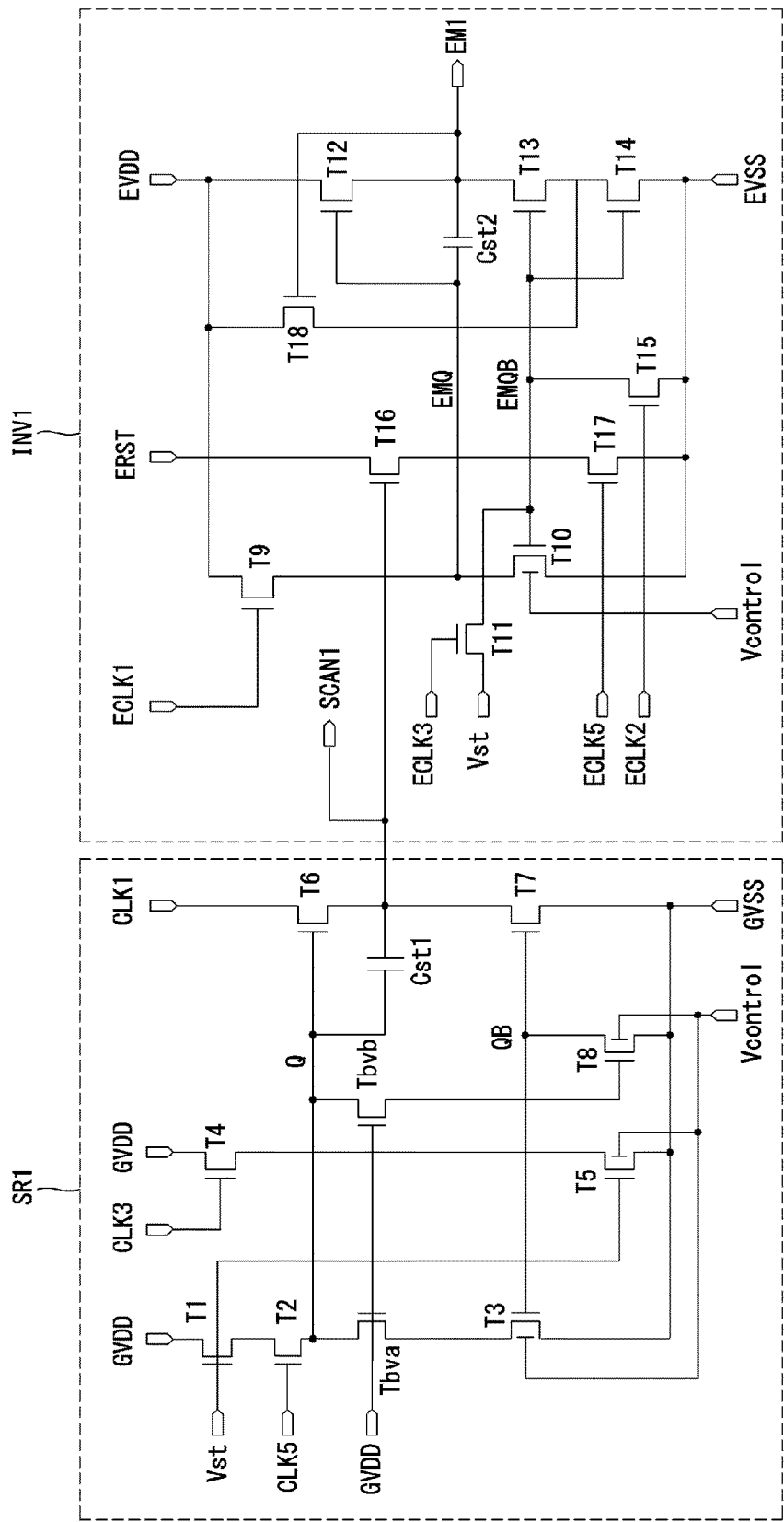
FIG. 7 shows a first example of a circuit configuration of a shift register and an inverter according to a first embodiment of the invention.
Figure 8:
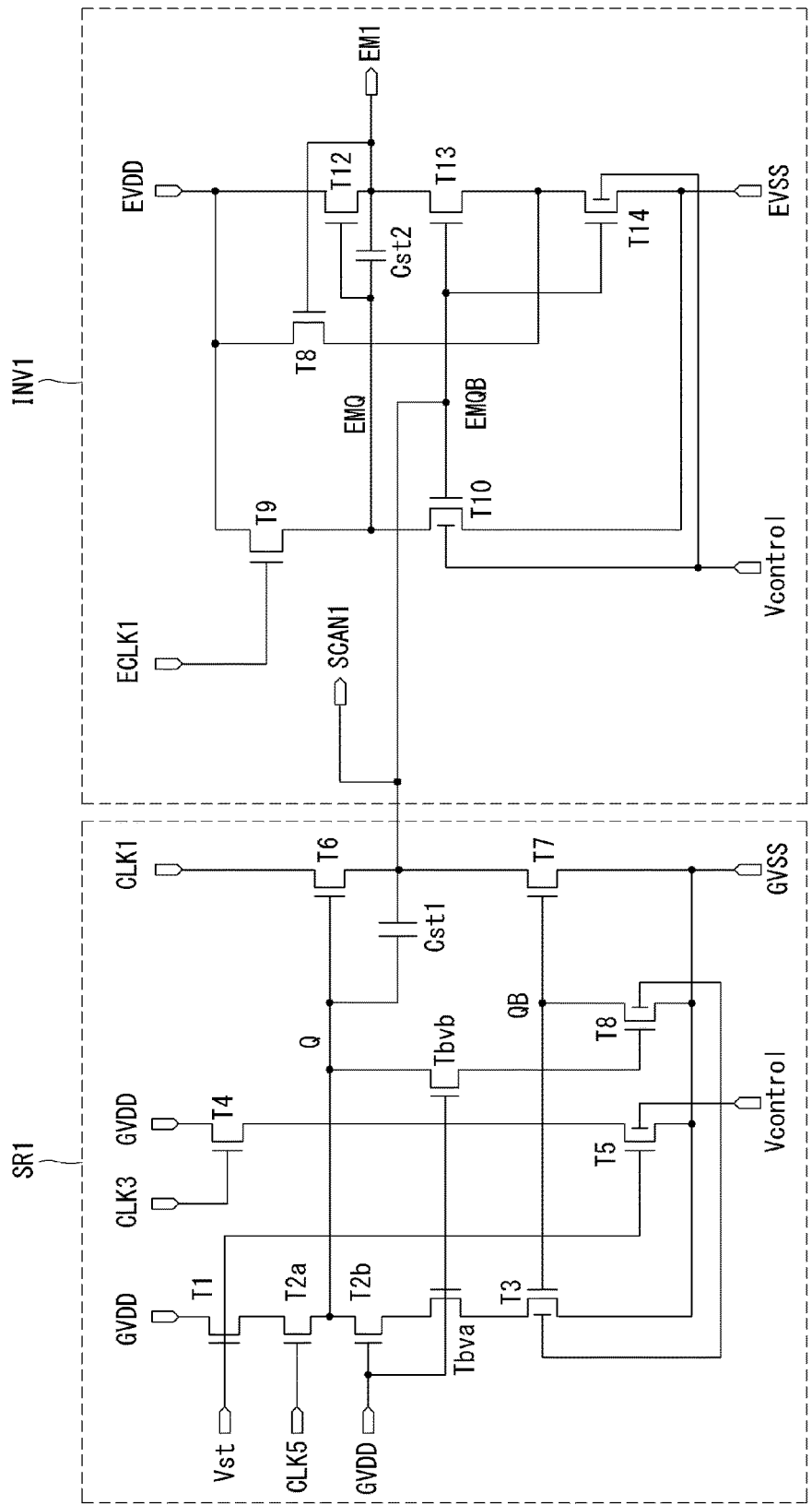
FIG. 8 shows a second example of a circuit configuration of a shift register and an inverter according to a first embodiment of the invention.

FIG. 4 shows a first example of circuit configuration of a subpixel. FIG. 5 shows a second example of circuit configuration of a subpixel. FIG. 6 is a block diagram partially showing a scan driver according to a first embodiment of the invention. FIG. 7 shows a first example of circuit configuration of a shift register and an inverter according to the first embodiment of the invention. FIG. 8 shows a second example of circuit configuration of a shift register and an inverter according to the first embodiment of the invention.

As shown in FIG. 4, a first example of a subpixel according to the first embodiment of the invention basically includes a first switching transistor SW1, a driving transistor DT, a storage capacitor Cst, and an organic light emitting diode (OLED). The first example of the subpixel according to the first embodiment of the invention further includes second to fifth switching transistors SW2 to SW5 included in a compensation circuit using an internal compensation manner.

Configurations, connection relationships, and functions of the second to fifth switching transistors SW2 to SW5 included in the internal compensation circuit are described below.

A gate electrode of the second switching transistor SW2 is connected to a 1B scan line EM1, a first electrode of the second switching transistor SW2 is connected to a reference voltage line VREF, and a second electrode of the second switching transistor SW2 is connected between the first switching transistor SW1 and the storage capacitor Cst. The second switching transistor SW2 functions to supply a reference voltage to a node connected to the first switching transistor SW1 and the storage capacitor Cst in response to a 1B scan signal.

A gate electrode of the third switching transistor SW3 is connected to a 1A scan line SCAN1, a first electrode of the third switching transistor SW3 is connected between the storage capacitor Cst and a gate electrode of the driving transistor DT, and a second electrode of the third switching transistor SW3 is connected to a second electrode of the driving transistor DT. The third switching transistor SW3 functions to form the driving transistor DT as a diode connection so as to help the sensing of a threshold voltage of the driving transistor DT in response to a 1A scan signal.

A gate electrode of the fourth switching transistor SW4 is connected to the 1B scan line EM1, a first electrode of the fourth switching transistor SW4 is connected to the second electrode of the driving transistor DT, and a second electrode of the fourth switching transistor SW4 is connected to an anode electrode of the OLED. The fourth switching transistor SW4 functions to control the emission of the OLED in response to the 1B scan signal.

A gate electrode of the fifth switching transistor SW5 is connected to the 1A scan line SCAN1, a first electrode of the fifth switching transistor SW5 is connected to the reference voltage line VREF, and a second electrode of the fifth switching transistor SW5 is connected to the anode electrode of the OLED. The fifth switching transistor SW5 functions to supply an initialization voltage to a node of the anode electrode of the OLED in response to the 1A scan signal.

As shown in FIG. 5, a second example of a subpixel according to the first embodiment of the invention basically includes a first switching transistor SW1, a driving transistor DT, a storage capacitor Cst, and an organic light emitting diode (OLED). The second example of the subpixel according to the first embodiment of the invention further includes second to fourth switching transistors SW2 to SW4 included in a compensation circuit using an internal compensation manner.

Configurations, connection relationships, and functions of the second to fourth switching transistors SW2 to SW4 included in the internal compensation circuit are described below.

A gate electrode of the second switching transistor SW2 is connected to a 1B scan line EM1, a first electrode of the second switching transistor SW2 is connected to a reference voltage line VREF, and a second electrode of the second switching transistor SW2 is connected between the first switching transistor SW1 and the storage capacitor Cst. The second switching transistor SW2 functions to supply a reference voltage to a node connected to the first switching transistor SW1 and the storage capacitor Cst in response to a 1B scan signal.

A gate electrode of the third switching transistor SW3 is connected to a 1A scan line SCAN1, a first electrode of the third switching transistor SW3 is connected between the storage capacitor Cst and a gate electrode of the driving transistor DT, and a second electrode of the third switching transistor SW3 is connected to a second electrode of the driving transistor DT. The third switching transistor SW3 functions to form the driving transistor DT as a diode connection so as to help the sensing of a threshold voltage of the driving transistor DT in response to a 1A scan signal.

A gate electrode of the fourth switching transistor SW4 is connected to the 1B scan line EM1, a first electrode of the fourth switching transistor SW4 is connected to the second electrode of the driving transistor DT, and a second electrode of the fourth switching transistor SW4 is connected to an anode electrode of the OLED. The fourth switching transistor SW4 functions to control the emission of the OLED in response to the 1B scan signal.

The embodiment of the invention described that both the basic configuration and the compensation circuit of the subpixel are of a p-type, as an example. However, the basic configuration and the compensation circuit of the subpixel may be of an n-type, and signal waveforms used in the subpixel may be changed suitably for the n-type. In the above description, a source electrode and a drain electrode of the transistor except the gate electrode of the transistor were referred to as the first electrode and the second electrode. This reason is to prevent the restrictive interpretation because terms of the source electrode and the drain electrode except the gate electrode of the transistor may be changed depending on a connection direction, a current (or voltage) supply direction, etc.

As shown in FIG. 6, a scan driver 130a according to the first embodiment of the invention includes a plurality of stages STG1 and STG2. The plurality of stages STG1 and STG2 have a cascade connected structure of the preceding stage and the subsequent stage and include shift registers SR1 and SR2 and inverters INV1 and INV2.

More specifically, the first stage STG1 includes the first shift register SR1 and the first inverter INV1. The first shift register SR1 outputs the 1A scan signal through the 1A scan line SCAN1, and the first inverter INV1 outputs the 1B scan signal through the 1B scan line EM1.

The second stage STG2 includes the second shift register SR2 and the second inverter INV2. The second shift register SR2 outputs a 2A scan signal through a 2A scan line SCAN2, and the second inverter INV2 outputs a 2B scan signal through a 2B scan line EM2.

The shift registers SR1 and SR2 and the inverters INV1 and INV2 of the scan driver 130a are formed in the gate-in panel (GIP) manner. In this instance, the shift registers SR1 and SR2 and the inverters INV1 and INV2 of the scan driver 130a are implemented as thin film transistors formed through a thin film process.

It is difficult to secure the reliability of the scan driver 130a because of degradation factors, such as a temperature, a bias voltage, and a stress time, generating changes in a threshold voltage of the thin film transistors constituting the scan driver 130a.

More specifically, a gate-to-source voltage Vgs of some of the thin film transistors included in the scan driver 130a is applied at a voltage level of about 0V. The thin film transistor has to be maintained in an Off-state when its threshold voltage Vth is not large. However, because the thin film transistor is in an On-state or a near On-state, a leakage current or an On-current is generated. This leads to a bad drive of the thin film transistor.

In particular, a voltage at a Q node or a QB node of the scan driver 130a has to be uniformly maintained. However, because the gate-to-source voltage Vgs of the thin film transistor is positively or negatively shifted, it is a fatal factor resulting in the bad reliability of the scan driver 130a.

To improve the reliability of the scan driver 130a, a process margin has to be secured so as to secure a margin of the threshold voltage during a process. However, the process margin can be secured, but multiple experiments for the process margin have to be conducted. In addition, because a process margin of the scan driver 130a and a process margin of the subpixel circuit are simultaneously secured, trade-off between the scan driver 130a and the subpixel circuit is generated. Hence it is not easy to improve the reliability of the scan driver 130a.

The first embodiment of the invention applies a separate voltage through a compensation line Vcontrol of the scan driver 130a and artificially controls the threshold voltage Vth of the thin film transistor (hereinafter, abbreviated to "transistor"), thereby improving a driving margin. Hereinafter, the first embodiment of the invention is described in detail based on two examples.

First Example

As shown in FIG. 7, a first example of a scan driver according to the first embodiment of the invention includes a first shift register SR1 and a first inverter INV1. The first shift register SR1 outputs a 1A scan signal through a 1A scan line SCAN1, and the first inverter INV1 outputs a 1B scan signal through a 1B scan line EM1.

The first shift register SR1 includes transistors T1 to T8 and a first capacitor Cst1. The transistors T1 to T8 and the first capacitor Cst1 control a Q node Q and a QB node QB and output the 1A scan signal corresponding to a scan high or a scan low depending on a charge state or a discharge state of the Q node Q and the QB node QB. A connection relationship and functions of a circuit included in the first shift register SR1 are described below.

A gate electrode of the T1 transistor T1 is connected to a start signal line Vst, a first electrode of the T1 transistor T1 is connected to a high potential power line GVDD, and a second electrode of the T1 transistor T1 is connected to a first electrode of the T2 transistor T2. The T1 transistor T1 functions to transmit a high potential power to the T2 transistor T2 in response to a start signal.

A gate electrode of the T2 transistor T2 is connected to a fifth clock signal line CLK5, the first electrode of the T2 transistor T2 is connected to the second electrode of the T1 transistor T1, and a second electrode of the T2 transistor T2 is connected to the Q node. The T2 transistor T2 functions to charge the Q node Q with the high potential power supplied through the T1 transistor T1 in response to a fifth clock signal.

A gate electrode of the T3 transistor T3 is connected to the QB node QB, a first electrode of the T3 transistor T3 is connected to a low potential power line GVSS, and a second electrode of the T3 transistor T3 is connected to a first electrode of a Tbva transistor Tbva. The T3 transistor T3 functions to transmit a low potential power to the Tbva transistor Tbva in response to a potential of the QB node QB.

A gate electrode of the Tbva transistor Tbva is connected to the high potential power line GVDD, the first electrode of the Tbva transistor Tbva is connected to the second electrode of the T3 transistor T3, and a second electrode of the Tbva transistor Tbva is connected to the Q node Q. The Tbva transistor Tbva functions to discharge the QB node QB with the low potential power supplied through the T3 transistor T3 in response to the high potential power.

A gate electrode of a Tbvb transistor Tbvb is connected to the high potential power line GVDD, a first electrode of the Tbvb transistor Tbvb is connected to the Q node Q, and a second electrode of the Tbvb transistor Tbvb is connected to a gate electrode of the T8 transistor T8. The Tbvb transistor Tbvb functions to control the T8 transistor T8 using the potential of the Q node Q in response to the high potential power.

A gate electrode of the T4 transistor T4 is connected to a third clock signal line CLK3, a first electrode of the T4 transistor T4 is connected to the high potential power line GVDD, and a second electrode of the T4 transistor T4 is connected to the QB node QB. The T4 transistor T4 functions to charge the QB node QB with the high potential power in response to a third clock signal.

A gate electrode of the T5 transistor T5 is connected to the start signal line Vst, a first electrode of the T5 transistor T5 is connected to the low potential power line GVSS, and a second electrode of the T5 transistor T5 is connected to the QB node QB. The T5 transistor T5 functions to discharge the QB node QB with the low potential power in response to the start signal.

A gate electrode of the T8 transistor T8 is connected to the second electrode of the Tbvb transistor Tbvb, a first electrode of the T8 transistor T8 is connected to the low potential power line GVSS, and a second electrode of the T8 transistor T8 is connected to the QB node QB. The T8 transistor T8 functions to discharge the QB node QB with the low potential power in response to a turn-on or turn-off operation of the Tbvb transistor Tbvb and the potential of the Q node Q.

A gate electrode of the T6 transistor T6 is connected to the Q node Q, a first electrode of the T6 transistor T6 is connected to a first clock signal line CLK1, and a second electrode of the T6 transistor T6 is connected to an output terminal SCAN1 of the first shift register SR1. The T6 transistor T6 functions to output a first clock signal as the 1A scan signal corresponding to the scan high in response to the potential of the Q node Q. The T6 transistor T6 is generally referred to as a pull-up transistor.

One end of the first capacitor Cst1 is connected to the Q node Q, and the other end is connected to the output terminal SCAN1 of the first shift register SR1. The first capacitor Cst1 functions to generate bootstrap in the output terminal SCAN1 of the first shift register SR1.

A gate electrode of the T7 transistor T7 is connected to the QB node QB, a first electrode of the T7 transistor T7 is connected to the low potential power line GVSS, and a second electrode of the T7 transistor T7 is connected to the output terminal SCAN1 of the first shift register SR1. The T7 transistor T7 functions to output the low potential power as the 1A scan signal corresponding to the scan low in response to the potential of the QB node QB. The T7 transistor T7 is generally referred to as a pull-down transistor.

The first shift register SR1 outputs the scan high as the 1A scan signal when the Q node Q is in a charge state and the QB node QB is in a discharge state, and outputs the scan low as the 1A scan signal when the QB node QB is in a charge state and the Q node Q is in a discharge state.

The T3, T5, and T8 transistors T3, T5, and T8 among the transistors T1 to T8 included in the first shift register SR1 have to perform a turn-on drive for a long time so as to maintain the scan low. Hence, the bad drive of the transistor may be generated due to the leakage current or the On-current resulting from the above-described problem.

Because of this, the first embodiment of the invention applies a separate voltage through the compensation line Vcontrol capable of artificially controlling the gate electrodes of the T3, T5, and T8 transistors T3, T5, and T8 and artificially controls the threshold voltage Vth of the thin film transistor, thereby improving the driving margin.

Each of the T3, T5, and T8 transistors T3, T5, and T8 commonly connected to the compensation line Vcontrol has two gate electrodes (namely, a double gate electrode structure) respectively positioned on and under a semiconductor layer. One of the two gate electrodes is connected to a control line and is used as a compensation gate electrode. However, the embodiment of the invention is not limited thereto, and also the transistors connected to the compensation line Vcontrol are not limited thereto.

The first inverter INV1 includes transistors T9 to T18 and a second capacitor Cst2. The transistors T9 to T18 and the second capacitor Cst2 control an EMQ node EMQ and an EMQB node EMQB and output the 1B scan signal corresponding to a scan high or a scan low depending on a charge state or a discharge state of the EMQ node EMQ and the EMQB node EMQB. The first inverter INV1 inverts a scan signal output through the output terminal SCAN1 of the first shift register SR1 and outputs it. A connection relationship and functions of a circuit included in the first inverter INV1 are described below.

A gate electrode of the T9 transistor T9 is connected to an E1 clock signal line ECLK1, a first electrode of the T9 transistor T9 is connected to an E1 high potential power line EVDD, and a second electrode of the T9 transistor T9 is connected to the EMQ node EMQ. The T9 transistor T9 functions to charge the EMQ node EMQ with an E1 high potential power in response to an E1 clock signal.

A gate electrode of the T10 transistor T10 is connected to the EMQB node EMQB, a first electrode of the T10 transistor T10 is connected to an E2 low potential power line EVSS, and a second electrode of the T10 transistor T10 is connected to the EMQ node EMQ. The T10 transistor T10 functions to discharge the EMQ node EMQ with an E2 low potential power in response to a potential of the EMQB node EMQB.

A gate electrode of the T11 transistor T11 is connected to an E3 clock signal line ECLK3, a first electrode of the T11 transistor T11 is connected to a start signal line Vst, and a second electrode of the T11 transistor T11 is connected to the EMQB node EMQB. The T11 transistor T11 functions to charge or discharge the EMQB node EMQB with a start signal in response to an E3 clock signal.

A gate electrode of the T15 transistor T15 is connected to an E2 clock signal line ECLK2, a first electrode of the T15 transistor T15 is connected to the E2 low potential power line EVSS, and a second electrode of the T15 transistor T15 is connected to the EMQB node EMQB. T15 transistor T15 functions to transmit the E2 low potential power to the EMQB node EMQB in response to an E2 clock signal.

A gate electrode of the T16 transistor T16 is connected to the output terminal SCAN1 of the first shift register SR1, a first electrode of the T16 transistor T16 is connected to an E reset signal line ERST, and a second electrode of the T16 transistor T16 is connected to the EMQB node EMQB. The T16 transistor T16 functions to reset the EMQB node EMQB with an E reset signal in response to a signal of the output terminal SCAN1 of the first shift register SR1.

A gate electrode of the T17 transistor T17 is connected to an E5 clock signal line ECLK5, a first electrode of the T17 transistor T17 is connected to the E2 low potential power line EVSS, and a second electrode of the T17 transistor T17 is connected to the EMQB node EMQB. The T17 transistor T17 functions to discharge the EMQB node EMQB with the E2 low potential power in response to an E5 clock signal.

A gate electrode of the T18 transistor T18 is connected to an output terminal EM1 of the first inverter INV1, a first electrode of the T18 transistor T18 is connected to the E1 high potential power line EVDD, and a second electrode of the T18 transistor T18 is connected to a first electrode of the T13 transistor T13 and a second electrode node of the T14 transistor T14. The T18 transistor T18 functions to transmit the E1 high potential power to the first electrode of the T13 transistor T13 and the second electrode node of the T14 transistor T14 in response to a signal of the output terminal EM1 of the first inverter INV1.

A gate electrode of the T12 transistor T12 is connected to the EMQ node EMQ, a first electrode of the T12 transistor T12 is connected to the E1 high potential power line EVDD, and a second electrode of the T12 transistor T12 is connected to the output terminal EM1 of the first inverter INV1. The T12 transistor T12 functions to output the E1 high potential power as the 1B scan signal corresponding to the scan high in response to the potential of the EMQ node EMQ. The T12 transistor T12 is generally referred to as a pull-up transistor.

One end of the second capacitor Cst2 is connected to the EMQ node EMQ, and the other end is connected to the output terminal EM1 of the first inverter INV1. The second capacitor Cst2 functions to generate bootstrap in the output terminal EM1 of the first inverter INV1.

A gate electrode of the T13 transistor T13 is connected to the EMQB node EMQB, the first electrode of the T13 transistor T13 is connected to a second electrode of the T14 transistor T14, and a second electrode of the T13 transistor T13 is connected to the output terminal EM1 of the first inverter INV1. The T13 transistor T13 functions to output the E2 low potential power as the 1B scan signal corresponding to the scan low in response to the potential of the EMQB node EMQB. The T13 transistor T13 is generally referred to as a pull-down transistor.

A gate electrode of the T14 transistor T14 is connected to the EMQB node EMQB, a first electrode of the T14 transistor T14 is connected to the E2 low potential power line EVSS, and the second electrode of the T14 transistor T14 is connected to the first electrode of the T13 transistor T13. The T14 transistor T14 functions to transmit the E2 low potential power to the first electrode of the T13 transistor T13 in response to the potential of the EMQB node EMQB. When the T14 transistor T14 is turned off, the T13 transistor T13 may receive the E1 high potential power. The T14 transistor T14 is generally referred to as a pull-down transistor.

The first inverter INV1 outputs the scan high as the 1B scan signal when the EMQ node EMQ is in a charge state and the EMQB node EMQB is in a discharge state, and outputs the scan low as the 1B scan signal when the EMQB node EMQB is in a charge state and the EMQ node EMQ is in a discharge state.

The T10 and T14 transistors T10 and T14 among the transistors T9 to T18 included in the first inverter INV1 have to perform a turn-on drive for a long time so as to maintain the scan low. Hence, the bad drive of the transistor may be generated due to the leakage current or the On-current resulting from the above-described problem.

Because of this, the first embodiment of the invention applies a separate voltage through the compensation line Vcontrol capable of artificially controlling the gate electrodes of the T10 and T14 transistors T10 and T14 and artificially controls the threshold voltage Vth of the thin film transistor, thereby improving the driving margin.

Each of the T10 and T14 transistors T10 and T14 commonly connected to the compensation line Vcontrol has two gate electrodes (namely, a double gate electrode structure) respectively positioned on and under a semiconductor layer. One of the two gate electrodes is connected to a control line and is used as a compensation gate electrode. However, the embodiment of the invention is not limited thereto, and also the transistors connected to the compensation line Vcontrol are not limited thereto.

Second Example

As shown in FIG. 8, a second example of a scan driver according to the first embodiment of the invention includes a first shift register SR1 and a first inverter INV1. The first shift register SR1 outputs a 1A scan signal through a 1A scan line SCAN1, and the first inverter INV1 outputs a 1B scan signal through a 1B scan line EM1.

The first shift register SR1 includes transistors T1 to T8 and a first capacitor Cst1. The transistors T1 to T8 and the first capacitor Cst1 control a Q node Q and a QB node QB and output the 1A scan signal corresponding to a scan high or a scan low depending on a charge state or a discharge state of the Q node Q and the QB node QB. A connection relationship and functions of a circuit included in the first shift register SR1 are described below.

A gate electrode of the T1 transistor T1 is connected to a start signal line Vst, a first electrode of the T1 transistor T1 is connected to a high potential power line GVDD, and a second electrode of the T1 transistor T1 is connected to a first electrode of a T2a transistor T2a. The T1 transistor T1 functions to transmit a high potential power to the T2a transistor T2a in response to a start signal.

A gate electrode of the T2a transistor T2a is connected to a fourth clock signal line CLK4, the first electrode of the T2a transistor T2a is connected to the second electrode of the T1 transistor T1, and a second electrode of the T2a transistor T2a is connected to a first electrode of a T2b transistor T2b. The T2a transistor T2a functions to transmit the high potential power to the T2b transistor T2b in response to a fourth clock signal.

A gate electrode of the T2b transistor T2b is connected to the high potential power line GVDD, the first electrode of the T2b transistor T2b is connected to the second electrode of the T2a transistor T2a, and a second electrode of the T2b transistor T2b is connected to the Q node Q. The T2b transistor T2b functions to charge the Q node Q with the high potential power supplied through the T2a transistor T2a in response to the high potential power.

A gate electrode of the T3 transistor T3 is connected to the QB node QB, a first electrode of the T3 transistor T3 is connected to a low potential power line GVSS, and a second electrode of the T3 transistor T3 is connected to a first electrode of a Tbva transistor Tbva. The T3 transistor T3 functions to transmit a low potential power to the Tbva transistor Tbva in response to a potential of the QB node QB.

A gate electrode of the Tbva transistor Tbva is connected to the high potential power line GVDD, the first electrode of the Tbva transistor Tbva is connected to the second electrode of the T3 transistor T3, and a second electrode of the Tbva transistor Tbva is connected to the Q node Q. The Tbva transistor Tbva functions to discharge the QB node QB with the low potential power supplied through the T3 transistor T3 in response to the high potential power.

A gate electrode of a Tbvb transistor Tbvb is connected to the high potential power line GVDD, a first electrode of the Tbvb transistor Tbvb is connected to the Q node Q, and a second electrode of the Tbvb transistor Tbvb is connected to a gate electrode of the T8 transistor T8. The Tbvb transistor Tbvb functions to control a turn-on or turn-off operation of the T8 transistor T8 using the potential of the Q node Q in response to the high potential power.

A gate electrode of the T4 transistor T4 is connected to a third clock signal line CLK3, a first electrode of the T4 transistor T4 is connected to the low potential power line GVSS, and a second electrode of the T4 transistor T4 is connected to the QB node QB. The T4 transistor T4 functions to discharge the QB node QB with the low potential power in response to a third clock signal.

A gate electrode of the T5 transistor T5 is connected to the start signal line Vst, a first electrode of the T5 transistor T5 is connected to the low potential power line GVSS, and a second electrode of the T5 transistor T5 is connected to the QB node QB. The T5 transistor T5 functions to discharge the QB node QB with the low potential power in response to the start signal.

A gate electrode of the T8 transistor T8 is connected to the second electrode of the Tbvb transistor Tbvb, a first electrode of the T8 transistor T8 is connected to the low potential power line GVSS, and a second electrode of the T8 transistor T8 is connected to the QB node QB. The T8 transistor T8 functions to discharge the QB node QB with the low potential power in response to a turn-on or turn-off operation of the Tbvb transistor Tbvb and the potential of the Q node Q.

A gate electrode of the T6 transistor T6 is connected to the Q node Q, a first electrode of the T6 transistor T6 is connected to a first clock signal line CLK1, and a second electrode of the T6 transistor T6 is connected to an output terminal SCAN1 of the first shift register SR1. The T6 transistor T6 functions to output a first clock signal as the 1A scan signal corresponding to the scan high in response to the potential of the Q node Q. The T6 transistor T6 is generally referred to as a pull-up transistor.

One end of the first capacitor Cst1 is connected to the Q node Q, and the other end is connected to the output terminal SCAN1 of the first shift register SR1. The first capacitor Cst1 functions to generate bootstrap in the output terminal SCAN1 of the first shift register SR1.

A gate electrode of the T7 transistor T7 is connected to the QB node QB, a first electrode of the T7 transistor T7 is connected to the low potential power line GVSS, and a second electrode of the T7 transistor T7 is connected to the output terminal SCAN1 of the first shift register SR1. The T7 transistor T7 functions to output the low potential power as the 1A scan signal corresponding to the scan low in response to the potential of the QB node QB. The T7 transistor T7 is generally referred to as a pull-down transistor.

The T3 and T8 transistors T3 and T8 among the transistors T1 to T8 included in the first shift register SR1 have to perform a turn-on drive for a long time so as to maintain the scan low. Hence, the bad drive of the transistor may be generated due to the leakage current or the On-current resulting from the above-described problem.

Because of this, the first embodiment of the invention applies a separate voltage through the compensation line Vcontrol capable of artificially controlling the gate electrodes of the T3 and T8 transistors T3 and T8 and artificially controls the threshold voltage Vth of the thin film transistor, thereby improving the driving margin.

Each of the T3 and T8 transistors T3 and T8 commonly connected to the compensation line Vcontrol has two gate electrodes (namely, a double gate electrode structure) respectively positioned on and under a semiconductor layer. One of the two gate electrodes is connected to a control line and is used as a compensation gate electrode. However, the embodiment of the invention is not limited thereto, and also the transistors connected to the compensation line Vcontrol are not limited thereto.

The first inverter INV1 includes transistors T9 to T14 and a second capacitor Cst2. The transistors T9 to T14 and the second capacitor Cst2 control an EMQ node EMQ and an EMQB node EMQB and output the 1B scan signal corresponding to a scan high or a scan low depending on a charge state or a discharge state of the EMQ node EMQ and the EMQB node EMQB. The first inverter INV1 inverts a scan signal output through the output terminal SCAN1 of the first shift register SR1 and outputs it. A connection relationship and functions of a circuit included in the first inverter INV1 are described below.

A gate electrode of the T9 transistor T9 is connected to an E1 clock signal line ECLK1, a first electrode of the T9 transistor T9 is connected to an E1 high potential power line EVDD, and a second electrode of the T9 transistor T9 is connected to the EMQ node EMQ. The T9 transistor T9 functions to charge the EMQ node EMQ with an E1 high potential power in response to an E1 clock signal.

A gate electrode of the T10 transistor T10 is connected to the EMQB node EMQB, a first electrode of the T10 transistor T10 is connected to an E2 low potential power line EVSS, and a second electrode of the T10 transistor T10 is connected to the EMQ node EMQ. The T10 transistor T10 functions to discharge the EMQ node EMQ with an E2 low potential power in response to a potential of the EMQB node EMQB.

A gate electrode of the T11 transistor T11 is connected to an output terminal EM1 of the first inverter INV1, a first electrode of the T11 transistor T11 is connected to the E1 high potential power line EVDD, and a second electrode of the T11 transistor T11 is connected to a first electrode of the T13 transistor T13 and a second electrode node of the T14 transistor T14. The T11 transistor T11 functions to transmit the E1 high potential power to the first electrode of the T13 transistor T13 and the second electrode node of the T14 transistor T14 in response to a signal of the output terminal EM1 of the first inverter INV1.

A gate electrode of the T12 transistor T12 is connected to the EMQ node EMQ, a first electrode of the T12 transistor T12 is connected to the E1 high potential power line EVDD, and a second electrode of the T12 transistor T12 is connected to the output terminal EM1 of the first inverter INV1. The T12 transistor T12 functions to output the E1 high potential power as the 1B scan signal corresponding to the scan high in response to the potential of the EMQ node EMQ. The T12 transistor T12 is generally referred to as a pull-up transistor.

One end of the second capacitor Cst2 is connected to the EMQ node EMQ, and the other end is connected to the output terminal EM1 of the first inverter INV1. The second capacitor Cst2 functions to generate bootstrap in the output terminal EM1 of the first inverter INV1.

A gate electrode of the T13 transistor T13 is connected to the EMQB node EMQB, the first electrode of the T13 transistor T13 is connected to a second electrode of the T14 transistor T14, and a second electrode of the T13 transistor T13 is connected to the output terminal EM1 of the first inverter INV1. The T13 transistor T13 functions to output the E2 low potential power as the 1B scan signal corresponding to the scan low in response to the potential of the EMQB node EMQB. The T13 transistor T13 is generally referred to as a pull-down transistor.

A gate electrode of the T14 transistor T14 is connected to the EMQB node EMQB, a first electrode of the T14 transistor T14 is connected to the E2 low potential power line EVSS, and the second electrode of the T14 transistor T14 is connected to the first electrode of the T13 transistor T13. The T14 transistor T14 functions to transmit the E2 low potential power to the first electrode of the T13 transistor T13 in response to the potential of the EMQB node EMQB. When the T14 transistor T14 is turned off, the T13 transistor T13 may receive the E1 high potential power. The T14 transistor T14 is generally referred to as a pull-down transistor.

The T10 and T14 transistors T10 and T14 among the transistors T9 to T14 included in the first inverter INV1 have to perform a turn-on drive for a long time so as to maintain the scan low. Hence, the bad drive of the transistor may be generated due to the leakage current or the On-current resulting from the above-described problem.

Because of this, the first embodiment of the invention applies a separate voltage through the compensation line Vcontrol capable of artificially controlling the gate electrodes of the T10 and T14 transistors T10 and T14 and artificially controls the threshold voltage Vth of the thin film transistor, thereby improving the driving margin.

Each of the T10 and T14 transistors T10 and T14 commonly connected to the compensation line Vcontrol has two gate electrodes (namely, a double gate electrode structure) respectively positioned on and under a semiconductor layer. One of the two gate electrodes is connected to a control line and is used as a compensation gate electrode. However, the embodiment of the invention is not limited thereto, and also the transistors connected to the compensation line Vcontrol are not limited thereto.

Figure 9:
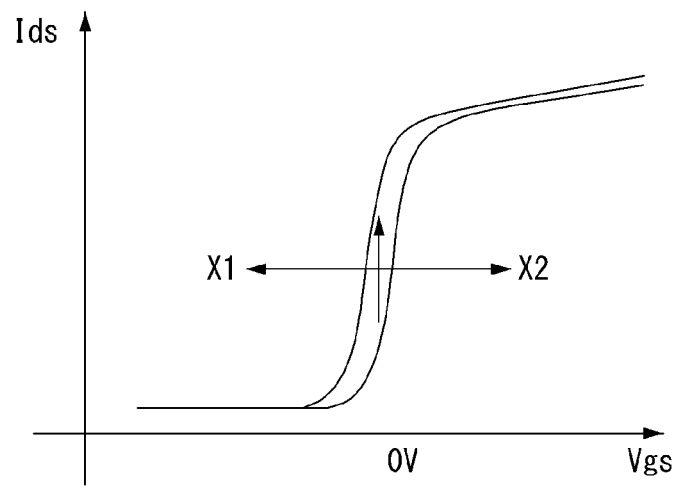
FIGS. 9 and 10 illustrate shift characteristics of a threshold voltage of a transistor.
Figure 10:
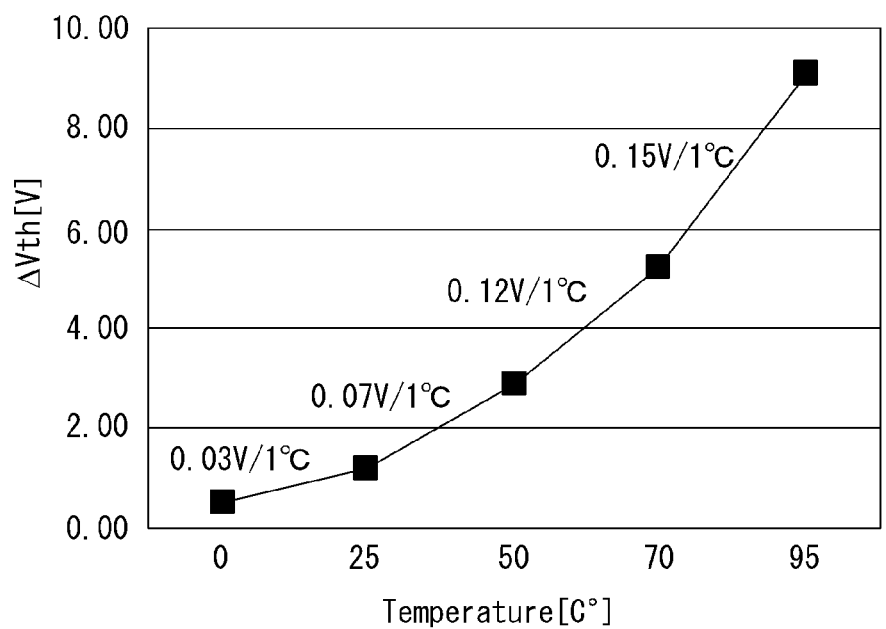
Figure 11:
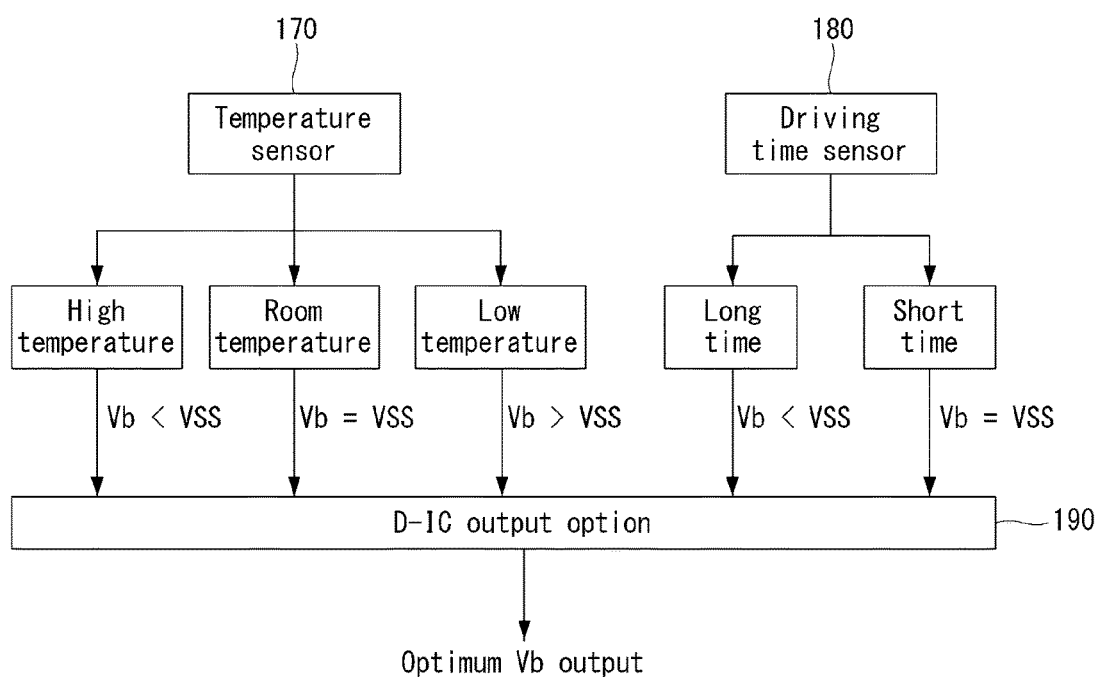
FIG. 11 shows a configuration of a compensation device according to a first embodiment of the invention.

FIGS. 9 and 10 illustrate shift characteristic of a threshold voltage of a transistor. FIG. 11 shows configuration of a compensation device according to the first embodiment of the invention.

There is an exponential relationship between a threshold voltage of a transistor included in the scan driver and a temperature. Namely, as the temperature rises, a driving time of the transistor increases. Hence, the shift of the threshold voltage of the transistor increases. In other words, main factors affecting the reliability of the transistor include the driving time and the temperature.

Because of this, the first embodiment of the invention applies a separate voltage (hereinafter, referred to as "compensation voltage") through the compensation line Vcontrol, so as to prevent a reduction in the reliability of the transistor generated when the threshold voltage of the transistor is positively or negatively shifted depending on changes in the driving time (refer to FIG. 9) or the temperature (refer to FIG. 10).

The first embodiment of the invention may further include a temperature sensor 170, a driving time sensor 180, and a compensation voltage output unit 190, so as to compensate for the scan driver more uniformly and accurately in consideration of the above conditions.

The temperature sensor 170 divides an environment of the scan driver into a high temperature, a room temperature, and a low temperature and transmits a sensing result of the environment of the scan driver to the compensation voltage output unit 190. For example, when the environment of the scan driver is the high temperature, the temperature sensor 170 transmits a signal capable of adjusting an output to the condition of "Vb<VSS" to the compensation voltage output unit 190. When the environment of the scan driver is the room temperature, the temperature sensor 170 transmits a signal capable of adjusting an output to the condition of "Vb=VSS" to the compensation voltage output unit 190. When the environment of the scan driver is the low temperature, the temperature sensor 170 transmits a signal capable of adjusting an output to the condition of "Vb>VSS" to the compensation voltage output unit 190.

The driving time sensor 180 divides the driving time of the scan driver into a long time and a short time and transmits a sensing result of the driving time of the scan driver to the compensation voltage output unit 190. For example, when the driving time of the scan driver is the long time, the driving time sensor 180 transmits a signal capable of adjusting an output to the condition of "Vb<VSS" to the compensation voltage output unit 190. When the driving time of the scan driver is the short time, the driving time sensor 180 transmits a signal capable of adjusting an output to the condition of "Vb=VSS" to the compensation voltage output unit 190.

The compensation voltage output unit 190 configures a voltage capable of outputting an optimum compensation voltage Vb in response to the signals transmitted from the temperature sensor 170 and the driving time sensor 180. In this instance, the compensation voltage output unit 190 may output the compensation voltage Vb reflecting all of the signals transmitted from the temperature sensor 170 and the driving time sensor 180, or may output the compensation voltage Vb reflecting the signal transmitted from one of the temperature sensor 170 and the driving time sensor 180.

Hence, the gate-to-source voltage of the transistor receiving the compensation voltage Vb may be maintained at 0V or the voltage close to 0V. In this instance, the compensation voltage output unit 190 may output the compensation voltage Vb in real time, or may output the compensation voltage Vb only during a blank period, in which an image is not displayed.

A compensation device including the temperature sensor 170, the driving time sensor 180, and the compensation voltage output unit 190 may be implemented by separate integrated circuits, or may be integrated with one of the image supply unit, the timing controller, the level shifter included in the scan driver, and the data driver.

The first embodiment of the invention applies a separate compensation voltage to the compensation gate electrode of the weak transistor, which performs a turn-on drive for a long time so as to maintain the scan low in a frame maintenance period, through the above-described configuration, thereby preventing the bad drive of the transistor.

The compensation device receives a feedback on temperature information or driving time information depending on an external environment and varies the compensation voltage based on the feedback. In this instance, the temperature information is a reference material capable of previously preventing the bad drive of the transistor, and the driving time information is a reference material capable of changing the driving conditions (for example, voltage, current, etc.) of the gate driver and the data driver. Therefore, the compensation device may vary the compensation voltage based on at least one of the temperature, the bias voltage, and the stress time (namely, the driving time) applied to the transistor having the compensation gate electrode.

As described above, the first embodiment of the invention forms the compensation gate electrode in the transistor and forms the compensation line capable of applying the separate compensation voltage to the compensation gate electrode, thereby preventing the bad drive of the transistor resulting from the temperature, the environment, and the driving time of the scan driver.

Hereinafter, a second embodiment of the invention is described using the liquid crystal display panel as an example of the display panel 150.

Second Embodiment

Figure 12:
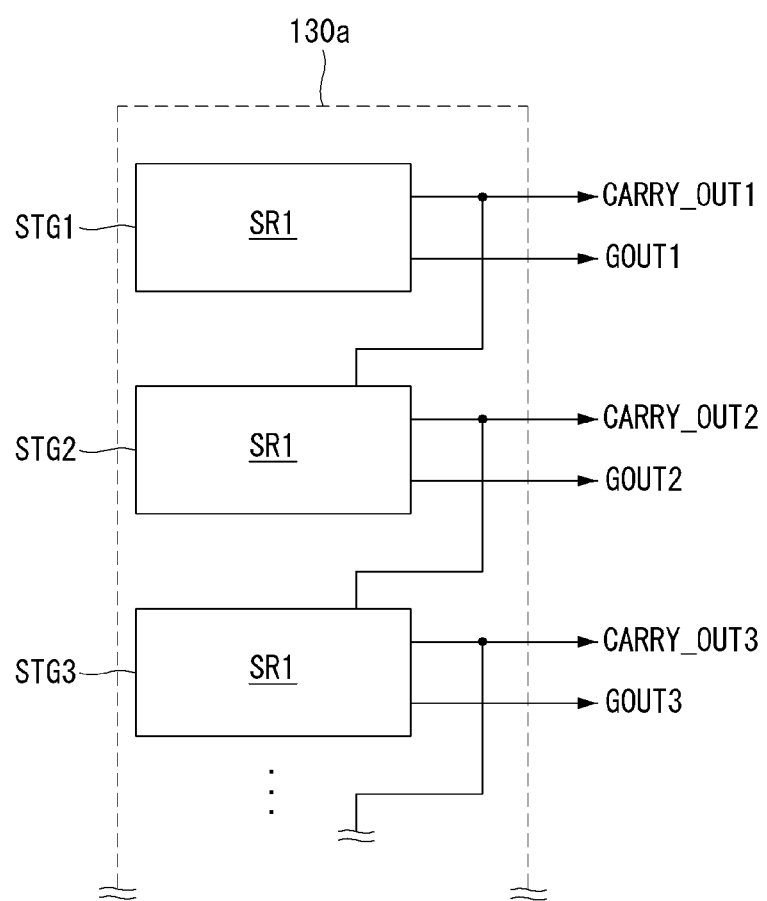
FIG. 12 is a block diagram partially showing a scan driver according to a second embodiment of the invention.
Figure 13:
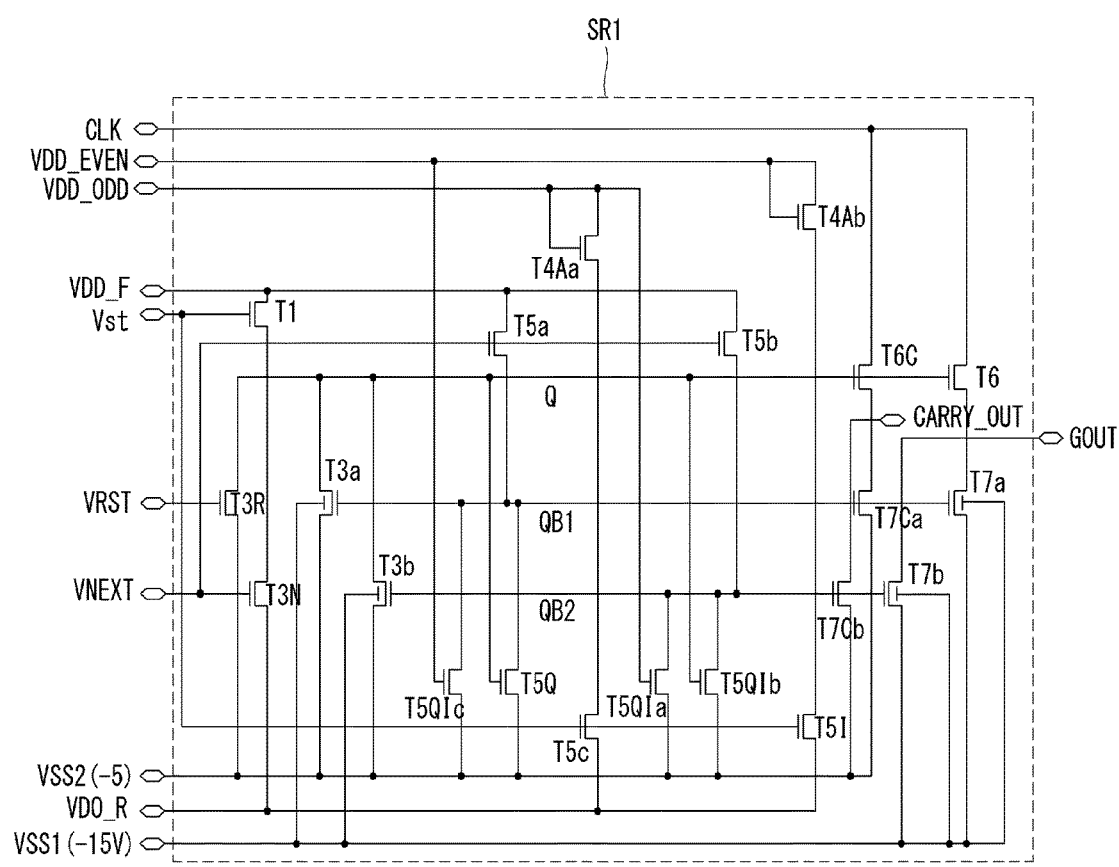
FIG. 13 shows an example of circuit configuration of a shift register according to a second embodiment of the invention.

FIG. 12 is a block diagram partially showing a scan driver according to a second embodiment of the invention. FIG. 13 shows an example of circuit configuration of a shift register according to the second embodiment of the invention.

As shown in FIG. 12, a scan driver 130a according to the second embodiment of the invention includes a plurality of stages STG1 to STG3. The plurality of stages STG1 to STG3 have a cascade connected structure of the preceding stage and the subsequent stage and include shift registers SR1, SR2, and SR3.

More specifically, the first stage STG1 includes the first shift register SR1. The first shift register SR1 outputs a first scan signal through a first scan line GOUT1. The first stage STG1 outputs a first carry signal controlling a next stage, i.e., the second stage STG2 through a first carry signal line CARRY_OUT1.

The second stage STG2 includes the second shift register SR2. The second shift register SR2 outputs a second scan signal through a second scan line GOUT2. The second stage STG2 outputs a second carry signal controlling a next stage, i.e., the third stage STG3 through a second carry signal line CARRY_OUT2.

The third stage STG3 includes the third shift register SR3. The third shift register SR3 outputs a third scan signal through a third scan line GOUT3. The third stage STG3 outputs a third carry signal controlling a next stage, i.e., a fourth stage (not shown) through a third carry signal line CARRY_OUT3.

The shift registers SR1 to SR3 of the scan driver 130a shown in FIG. 12 are formed in the gate-in panel (GIP) manner. In this instance, each of the shift registers SR1 to SR3 is implemented as a thin film transistor formed through a thin film process.

It is difficult to secure the reliability of the scan driver 130a because of degradation factors, such as a temperature, a bias voltage, and a stress time, generating changes in a threshold voltage of the thin film transistors constituting the scan driver 130a.

More specifically, a gate-to-source voltage Vgs of some of the thin film transistors included in the scan driver 130a is applied at a voltage level of about 0V. The thin film transistor has to be maintained in an Off-state when its threshold voltage Vth is not large. However, because the thin film transistor is in an On-state or a near On-state, a leakage current or an On-current is generated. This leads to a bad drive of the thin film transistor.

In particular, a voltage at a Q node or a QB node of the scan driver 130a has to be uniformly maintained. However, because the gate-to-source voltage Vgs of the thin film transistor is positively or negatively shifted, it is a fatal factor resulting in the bad reliability of the scan driver 130a.

To improve the reliability of the scan driver 130a, a process margin has to be secured so as to secure a margin of the threshold voltage during a process. However, the process margin can be secured, but multiple experiments for the process margin have to be conducted. In addition, because a process margin of the scan driver 130a and a process margin of the subpixel circuit are simultaneously secured, trade-off between the scan driver 130a and the subpixel circuit is generated. Hence it is not easy to improve the reliability of the scan driver 130a.

The second embodiment of the invention applies a separate voltage through a low potential power line of the scan driver 130a and artificially controls the threshold voltage Vth of the thin film transistor (hereinafter, abbreviated to "transistor"), thereby improving a driving margin. Hereinafter, the second embodiment of the invention is described in detail based on one example.

As shown in FIG. 13, the scan driver according to the second embodiment of the invention includes the first shift register SR1. The first shift register SR1 outputs the first scan signal and the first carry signal through the first scan line GOUT1.

The first shift register SR1 includes transistors T1 and T3a to T7b. The transistors T1 to T7b control a Q node Q, a QB1 node QB1, and a QB2 node QB2 and output the first scan signal and the first carry signal corresponding to a scan high or a scan low depending on a charge state or a discharge state of the Q node Q, the QB1 node QB1, and the QB2 node QB2.

The QB1 node QB1 and the QB2 node QB2 are alternately driven (or AC driven) every at least one frame. Namely, when the QB1 node QB1 is in the charge state (i.e., a driving state), the QB2 node QB2 is in the discharge state (i.e., a non-drive state). When the QB1 node QB1 is in the discharge state, the QB2 node QB2 is in the charge state. A connection relationship and functions of a circuit included in the first shift register SR1 are described below.

A gate electrode of the T1 transistor T1 is connected to a start signal line Vst, a first electrode of the T1 transistor T1 is connected to an F high potential power line VDD_F, and a second electrode of the T1 transistor T1 is connected to the Q node Q. The T1 transistor T1 functions to charge the Q node Q with an F high potential power in response to a start signal. When the Q node Q is charged with the F high potential power, the first shift register SR1 performs a scan operation in a forward direction and outputs the first scan signal and the first carry signal.

A gate electrode of the T3N transistor T3N is connected to a next signal line (indicating an output terminal of a shift register of a next stage or a stage after next) VNEXT, a first electrode of the T3N transistor T3N is connected to an R high potential power line VDD_R, and a second electrode of the T3N transistor T3N is connected to the Q node Q. The T3N transistor T3N functions to charge the Q node Q with an R high potential power in response to a next signal. When the Q node Q is charged with the R high potential power, the first shift register SR1 performs a scan operation in a reverse direction and outputs the first scan signal and the first carry signal. The power supplied through the F high potential power and the R high potential power swings in an AC (alternating current) type.

A gate electrode of the T3R transistor T3R is connected to a reset signal line VRST, a first electrode of the T3R transistor T3R is connected to a second low potential power line VSS2, and a second electrode of the T3R transistor T3R is connected to the Q node Q. The T3R transistor T3R functions to discharge the Q node Q with a low potential power in response to a reset signal.

A gate electrode of the T3a transistor T3a is connected to the QB1 node QB1, a compensation gate electrode of the T3a transistor T3a is connected to a first low potential power line VSS1, a first electrode of the T3a transistor T3a is connected to the second low potential power line VSS2, and a second electrode of the T3a transistor T3a is connected to the Q node Q. The T3a transistor T3a functions to discharge the Q node Q with the low potential power in response to a potential of the QB1 node QB1. The T3a transistor T3a receives a compensation voltage through the compensation gate electrode connected to the first low potential power line VSS1 for a previously set time (or period).

A gate electrode of the T3b transistor T3b is connected to the QB2 node QB2, a compensation gate electrode of the T3b transistor T3b is connected to the first low potential power line VSS1, a first electrode of the T3b transistor T3b is connected to the second low potential power line VSS2, and a second electrode of the T3b transistor T3b is connected to the Q node Q. The T3b transistor T3b functions to discharge the Q node Q with a second low potential power in response to a potential of the QB2 node QB2. The T3b transistor T3b receives a compensation voltage through the compensation gate electrode connected to the first low potential power line VSS1 for a previously set time (or period).

A gate electrode and a first electrode of the T4Aa transistor T4Aa are connected to an ODD power line VDD_ODD, and a second electrode of the T4Aa transistor T4Aa is connected to the QB1 node QB1. The T4Aa transistor T4Aa functions to charge the QB1 node QB1 with an ODD power in response to the ODD power.

A gate electrode and a first electrode of the T4Ab transistor T4Ab are connected to an EVEN power line VDD_EVEN, and a second electrode of the T4Ab transistor T4Ab is connected to the QB2 node QB2. The T4Ab transistor T4Ab functions to charge the QB2 node QB2 with an EVEN power in response to the EVEN power.

A gate electrode of the T5a transistor T5a is connected to the next signal line VNEXT, a first electrode of the T5a transistor T5a is connected to the F high potential power line VDD_F, and a second electrode of the T5a transistor T5a is connected to the QB1 node QB1. The T5a transistor T5a functions to charge the QB1 node QB1 with the F high potential power in response to the next signal.

A gate electrode of the T5b transistor T5b is connected to the next signal line VNEXT, a first electrode of the T5b transistor T5b is connected to the F high potential power line VDD_F, and a second electrode of the T5b transistor T5b is connected to the QB2 node QB2. The T5b transistor T5b functions to charge the QB2 node QB2 with the F high potential power in response to the next signal.

A gate electrode of the T5c transistor T5c is connected to the start signal line Vst, a first electrode of the T5c transistor T5c is connected to the R high potential power line VDD_R, and a second electrode of the T5c transistor T5c is connected to the QB1 node QB1. The T5c transistor T5c functions to charge the QB1 node QB1 with the R high potential power in response to the start signal.

A gate electrode of the T5Q transistor T5Q is connected to the start signal line Vst, a first electrode of the T5Q transistor T5Q is connected to the R high potential power line VDD_R, and a second electrode of the T5Q transistor T5Q is connected to the QB1 node QB1. The T5Q transistor T5Q functions to charge the QB1 node QB1 with the R high potential power in response to the start signal.

A gate electrode of the T5I transistor T5I is connected to the start signal line Vst, a first electrode of the T5I transistor T5I is connected to the R high potential power line VDD_R, and a second electrode of the T5I transistor T5I is connected to the QB2 node QB2. The T5I transistor T5I functions to charge the QB2 node QB2 with the R high potential power in response to the start signal.

A gate electrode of the 5QIa transistor 5QIa is connected to the ODD power line VDD_ODD, a first electrode of the 5QIa transistor 5QIa is connected to the second low potential power line VSS2, and a second electrode of the 5QIa transistor 5QIa is connected to the QB2 node QB2. The 5QIa transistor 5QIa functions to discharge the QB2 node QB2 with the second low potential power in response to the ODD power.

A gate electrode of the 5QIb transistor 5QIb is connected to the Q node Q, a first electrode of the 5QIb transistor 5QIb is connected to the second low potential power line VSS2, and a second electrode of the 5QIb transistor 5QIb is connected to the QB2 node QB2. The 5QIb transistor 5QIb functions to discharge the QB2 node QB2 with the second low potential power in response to the potential of the Q node Q.

A gate electrode of the T5QIc transistor T5QIc is connected to the EVEN power line VDD_EVEN, a first electrode of the T5QIc transistor T5QIc is connected to the second low potential power line VSS2, and a second electrode of the T5QIc transistor T5QIc is connected to the QB1 node QB1. The T5QIc transistor T5QIc functions to discharge the QB1 node QB1 with the second low potential power in response to the EVEN power.

A gate electrode of the T6C transistor T6C is connected to the Q node Q, a first electrode of the T6C transistor T6C is connected to a clock signal line CLK, and a second electrode of the T6C transistor T6C is connected to a carry signal output terminal CARYY_OUT1 of the first shift register SR1. The T6C transistor T6C functions to output a clock signal as the first carry signal in response to the potential of the Q node Q.

A gate electrode of the T6 transistor T6 is connected to the Q node Q, a first electrode of the T6 transistor T6 is connected to the clock signal line CLK, and a second electrode of the T6 transistor T6 is connected to a scan signal output terminal GOUT1 of the first shift register SR1. The T6 transistor T6 functions to output a clock signal as the first scan signal in response to the potential of the Q node Q. The T6 transistor T6 is generally referred to as a pull-up transistor.

A gate electrode of the T7Ca transistor T7Ca is connected to the QB1 node QB1, a first electrode of the T7Ca transistor T7Ca is connected to the second low potential power line VSS2, and a second electrode of the T7Ca transistor T7Ca is connected to the carry signal output terminal CARYY_OUT1 of the first shift register SR1. The T7Ca transistor T7Ca functions to output the second low potential power as the first carry signal in response to the potential of the QB1 node QB1.

A gate electrode of the T7Cb transistor T7Cb is connected to the QB2 node QB2, a first electrode of the T7Cb transistor T7Cb is connected to the second low potential power line VSS2, and a second electrode of the T7Cb transistor T7Cb is connected to the carry signal output terminal CARYY_OUT1 of the first shift register SR1. The T7Cb transistor T7Cb functions to output the second low potential power as the first carry signal in response to the potential of the QB2 node QB2.

A gate electrode of the T7a transistor T7a is connected to the QB1 node QB1, a first electrode of the T7a transistor T7a is connected to the first low potential power line VSS1, and a second electrode of the T7a transistor T7a is connected to the scan signal output terminal GOUT1 of the first shift register SR1. The T7a transistor T7a functions to output the first low potential power as the first scan signal in response to the potential of the QB1 node QB1. The T7a transistor T7a is generally referred to as a pull-down transistor.

A gate electrode of the T7b transistor T7b is connected to the QB2 node QB2, a first electrode of the T7b transistor T7b is connected to the first low potential power line VSS1, and a second electrode of the T7b transistor T7b is connected to the scan signal output terminal GOUT1 of the first shift register SR1. The T7b transistor T7b functions to output the first low potential power as the first scan signal in response to the potential of the QB2 node QB2. The T7a transistor T7a is generally referred to as a pull-down transistor.

The first shift register SR1 outputs the scan high as the first scan signal when the Q node Q is in a charge state and the QB1 and QB2 nodes QB1 and QB2 are in a discharge state, and outputs the scan low as the first scan signal when the QB1 or QB2 node QB1 or QB2 is in a charge state and the Q node Q is in a discharge state. In this instance, the QB1 node QB1 and the QB2 node QB2 are alternately driven (or AC driven) every at least one frame.

The transistors T3a, T3b, T7a, and T7b among the transistors T1 to T7b included in the first shift register SR1 have to perform a turn-on drive for a long time so as to maintain the scan low. Hence, the bad drive of the transistor may be generated due to the leakage current or the On-current resulting from the above-described problem.

Because of this, the second embodiment of the invention applies a separate voltage through the first low potential power line VSS1 capable of artificially controlling the gate electrodes of the transistors T3a, T3b, T7a, and T7b and artificially controls the threshold voltage Vth of the thin film transistor, thereby improving the driving margin.

Each of the transistors T3a, T3b, T7a, and T7b connected to the first low potential power line VSS1 has two gate electrodes (namely, a double gate electrode structure) respectively positioned on and under a semiconductor layer. One of the two gate electrodes is connected to the first low potential power line VSS1 and is used as a compensation gate electrode. However, the embodiment of the invention is not limited thereto, and also the transistors connected to the first low potential power line VSS1 are not limited thereto.

When a positive voltage is applied to the compensation gate electrode, the threshold voltage of the transistor is shifted in a direction (+). When a negative voltage is applied to the compensation gate electrode, the threshold voltage of the transistor is shifted in a direction (−). Further, when a bias voltage is supplied to the compensation gate electrode while alternating a polarity of the bias voltage, ΔVth (Threshold voltage shift characteristic of the transistor) may be canceled out.

In the pull-down transistors T7a and T7b according to the second embodiment of the invention, a bottom gate positioned under the semiconductor layer is connected to the QB1 node QB1 or the QB2 node QB2 and is driven in the related art manner.

On the other hand, a top gate positioned on the semiconductor layer of the pull-down transistors T7a and T7b becomes a negative bias due to the first low potential power (refer to the voltage (−15V) of VSS1) less than the second low potential power (refer to the voltage (−5V) of VSS2). However, the voltage (−5V) of the second low potential power VSS2 and the voltage (−15V) of the first low potential power VSS1 are merely examples and are not limited. For example, voltage or signals of different levels may be used for VSS1 and VSS2.

The second embodiment of the invention is continuously described based on the result of an experiment.

Figure 14:
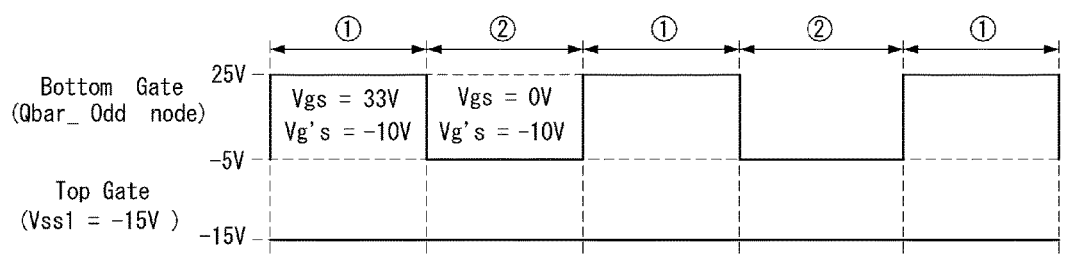
FIG. 14 indicates a compensation voltage of a shift register according to a second embodiment of the invention.
Figure 15:
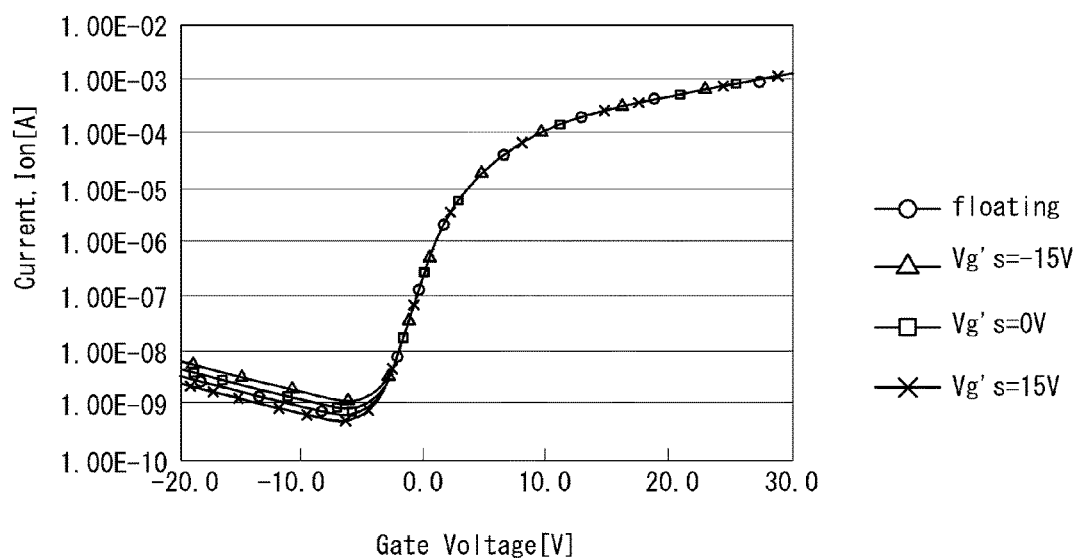
FIGS. 15 and 16 show the result of an experiment according to a second embodiment of the invention.
Figure 16:
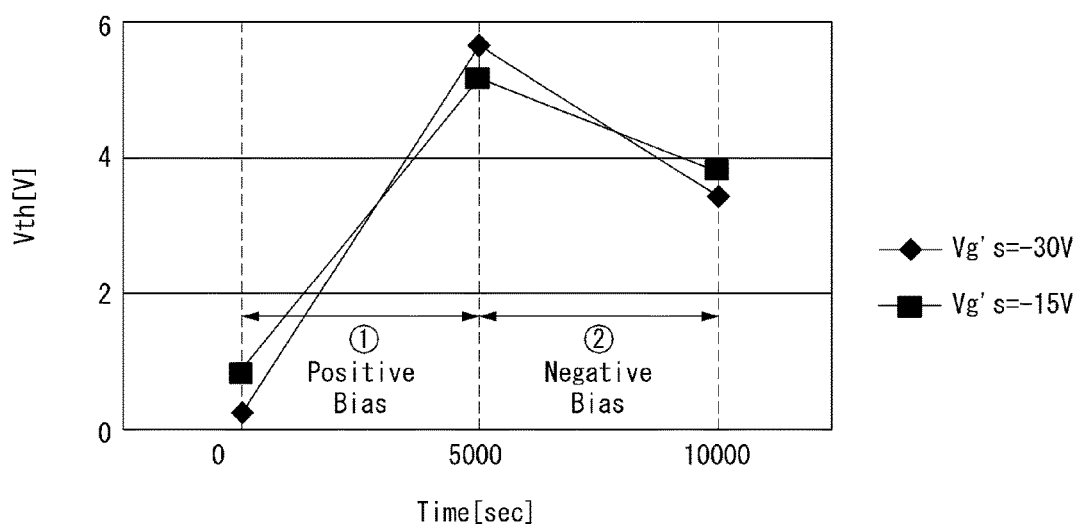

FIG. 14 indicates the compensation voltage of the shift register according to the second embodiment of the invention. FIGS. 15 and 16 show the result of an experiment according to the second embodiment of the invention.

As shown in FIGS. 14 and 15, a voltage, which swings between −5V and 25V, is applied to the bottom gate of the pull-down transistor. On the contrary, the compensation voltage corresponding to −15V is uniformly applied to the top gate of the pull-down transistor.

Hence, a voltage Vgs of the bottom gate of the pull-down transistor is 33V in a period ① and is 0V in a period ②. However, a voltage Vg's of the top gate of the pull-down transistor is always uniformly maintained to −10V irrespective of the periods.

As the result of an experiment according to the second embodiment of the invention, there is no changes in the on-current resulting from the use (or the application) of the top gate of the pull-down transistor when measuring a transfer curve. Namely, even when the negative compensation voltage was always applied to the top gate of the pull-down transistor as in the second embodiment of the invention, a limit to an operation of the circuit was not found. When the negative compensation voltage was applied as in the second embodiment of the invention, it was confirmed that the shift characteristics of the threshold voltage can be recovered.

As shown in FIG. 16, in the period ①, the positive bias was applied to the QB node, and a bias temperature stress (BTS) of the element was measured. As a result, the threshold voltage shift characteristic Vth Shift was 5.41V when the Vgs of 30V was applied.

In the period ②, the negative bias was applied to the QB node, the first low potential power is applied to the top gate of the pull-down transistor, and the BTS of the element was measured. The result was as follows.

(1) The threshold voltage shift characteristic Vth Shift of −2.41V when applying the Vg's of −30V (2) The threshold voltage shift characteristic Vth Shift of −1.34V when applying the Vg's of −15V Thus, when the compensation voltage is supplied under the same conditions as the second embodiment of the invention, it is expected that the threshold voltage will be shifted to −1.1V at Vg's of −10V.

Therefore, both the method for supplying the compensation voltage through the separate control line as in the first embodiment of the invention and the method for supplying the compensation voltage through the low potential power line as in the second embodiment of the invention can secure the reliability from the degradation factors, such as the temperature, the bias voltage, and the stress time, generating changes in the threshold voltage of the thin film transistor.

The second embodiment of the invention applies a separate compensation voltage to the compensation gate electrode of the weak transistor, which performs a turn-on drive for a long time so as to maintain the scan low in a frame maintenance period, through the above-described configuration, thereby preventing the bad drive of the transistor.

The second embodiment of the invention may implement the circuit using the compensation device shown in FIG. 11. The compensation device receives a feedback on temperature information or driving time information depending on an external environment and varies the compensation voltage based on the feedback. In this instance, the temperature information is a reference material capable of previously preventing the bad drive of the transistor, and the driving time information is a reference material capable of changing the driving conditions (for example, voltage, current, etc.) of the gate driver and the data driver.

The second embodiment of the invention forms the compensation gate electrode in the transistor and connects the compensation gate electrode to the low potential power line, thereby preventing the bad drive of the scan driver resulting from the temperature, the environment, the driving time, etc.

Hereinafter, a method for forming the double gate electrode structure used to apply the compensation voltage is described. The structure of the transistor having the double gate electrode structure can be equally applied to the OLED display panel and the liquid crystal display panel. Therefore, in the following description, the method for forming the double gate electrode structure is described using the liquid crystal display panel as an example for the sake of brevity and ease of reading.

Third Embodiment

FIGS. 17 to 22 are flow diagrams of processes in a method for manufacturing a scan driver according to a third embodiment of the invention.

Figure 17:
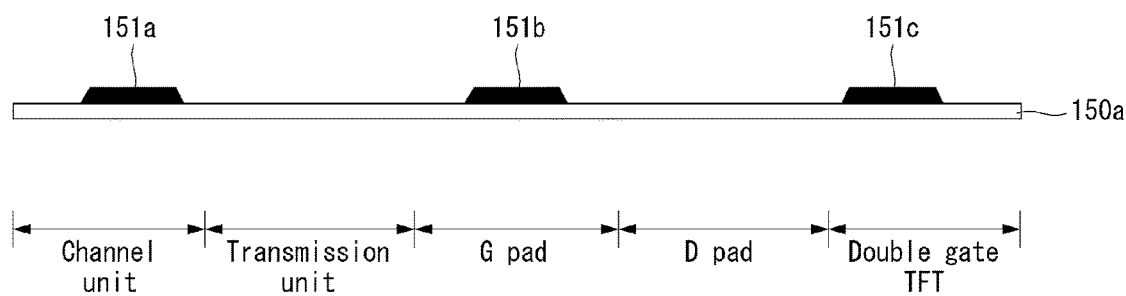
FIGS. 17 to 22 are flow diagrams of processes in a method for manufacturing a scan driver according to a third embodiment of the invention.

As shown in FIG. 17, an area of each of a channel unit, a transmission unit, a G pad, a D pad, and a double gate thin film transistor (TFT) is defined on a substrate 150a. The channel unit is an area in which a general transistor is formed. The transmission unit is an area which transmits and emits light of a liquid crystal display panel. The G pad is an area in which a gate pad connected to a scan line is formed. The D pad is an area in which a data pad connected to a data line is formed. The double gate TFT is an area in which a transistor having a double gate electrode structure is formed.

A first gate electrode 151a, a second gate electrode 151b, and a third gate electrode 151c are respectively formed in the channel unit, the G pad, and the double gate TFT defined on the substrate 150a. The first to third gate electrodes 151a to 151c may be formed of one selected from the group consisting of molybdenum (Mo), aluminum (Al), chrome (Cr), gold (Au), titanium (Ti), nickel (Ni), and copper (Cu) or a combination thereof and may have a single-layered structure or a multi-layered structure.

Figure 18:
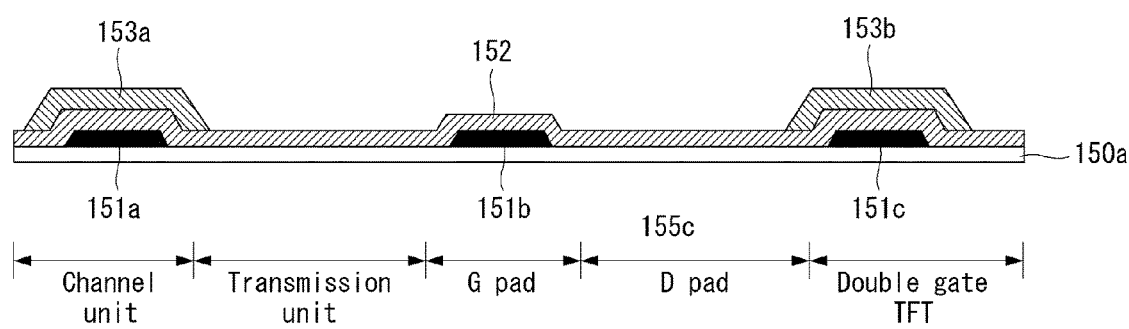

As shown in FIG. 18, a first insulating layer 152 is formed to cover the first to third gate electrodes 151a to 151c formed on the substrate 150a. The first insulating layer 152 may be formed of silicon oxide (SiOx) or silicon nitride (SiNx).

A first semiconductor layer 153a and a second semiconductor layer 153b are formed on the first insulating layer 152 positioned in the channel unit and the double gate TFT defined on the substrate 150a. The first semiconductor layer 153a and the second semiconductor layer 153b may be formed of one of graphene-based material including silicon-based material, oxide-based material, and carbon nanotube (CNT), nitride-based material, and organic semiconductor-based material.

Figure 19:
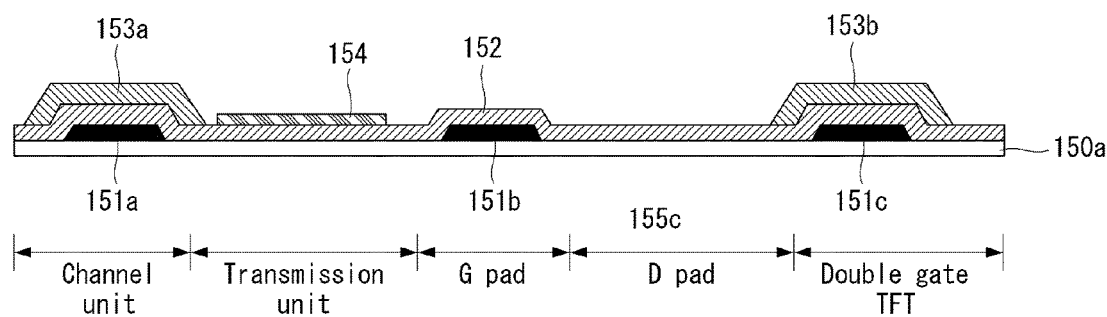

As shown in FIG. 19, a pixel electrode 154 is formed on the first insulating layer 152 positioned in the transmission unit defined on the substrate 150a. The pixel electrode 154 may be formed of transparent metal oxide, such as ITO (Indium Tin Oxide), IZO (Indium Zinc Oxide), ITZO (Indium Tin Zinc Oxide), ZnO (Zinc Oxide), IGZO (Indium Gallium Zinc Oxide), and graphene.

Figure 20:
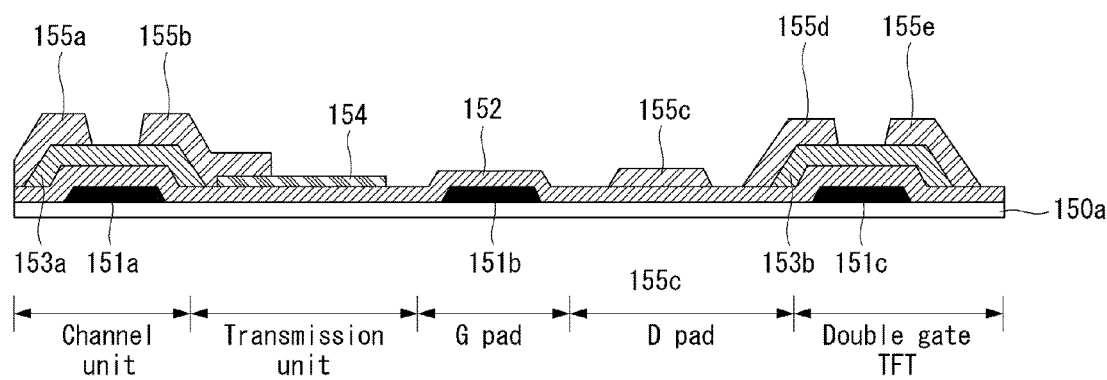

As shown in FIG. 20, a first drain electrode 155a and a first source electrode 155b are formed on the first semiconductor layer 153a positioned in the channel unit defined on the substrate 150a. Because the first source electrode 155b partially covers the pixel electrode 154 underlying the first source electrode 155b, the first source electrode 155b and the pixel electrode 154 directly contact each other. A data electrode 155c is formed on the first insulating layer 152 positioned in the D pad defined on the substrate 150a. A second drain electrode 155d and a second source electrode 155e are formed on the second semiconductor layer 153b positioned in the double gate TFT defined on the substrate 150a.

After the first drain electrode 155a, the first source electrode 155b, the data electrode 155c, the second drain electrode 155d, and the second source electrode 155e are formed of the same data metal, they are patterned and separated. The data metal may be one selected from the group consisting of molybdenum (Mo), aluminum (Al), chrome (Cr), gold (Au), titanium (Ti), nickel (Ni), and copper (Cu) or a combination thereof. They may have a single-layered structure or a multi-layered structure.

Figure 21:
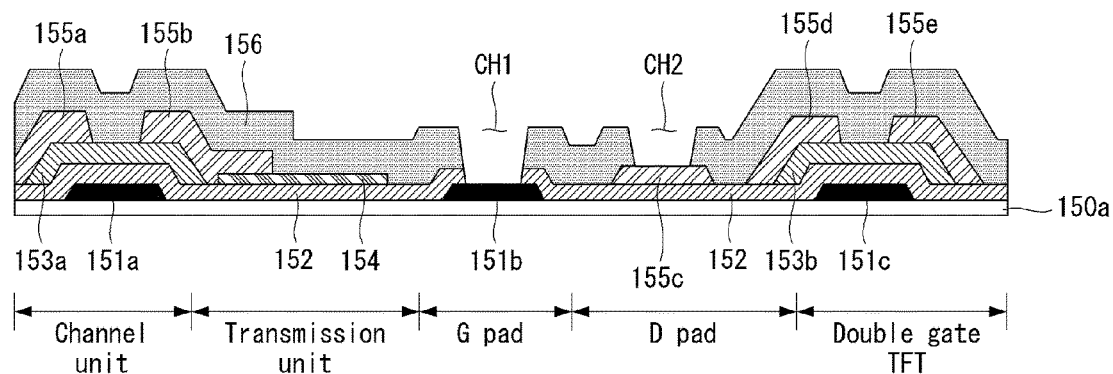

As shown in FIG. 21, a second insulating layer 156 is formed to cover the first drain electrode 155a, the first source electrode 155b, the data electrode 155c, the second drain electrode 155d, and the second source electrode 155e formed on the substrate 150a. The second insulating layer 156 may be formed of silicon oxide (SiOx) or silicon nitride (SiNx).

The second insulating layer 156 may be used as a protective layer. The second insulating layer 156 has a first contact hole CH1 exposing the second gate electrode 151b positioned in the G pad and a second contact hole CH2 exposing the data electrode 155c positioned in the D pad.

Figure 22:
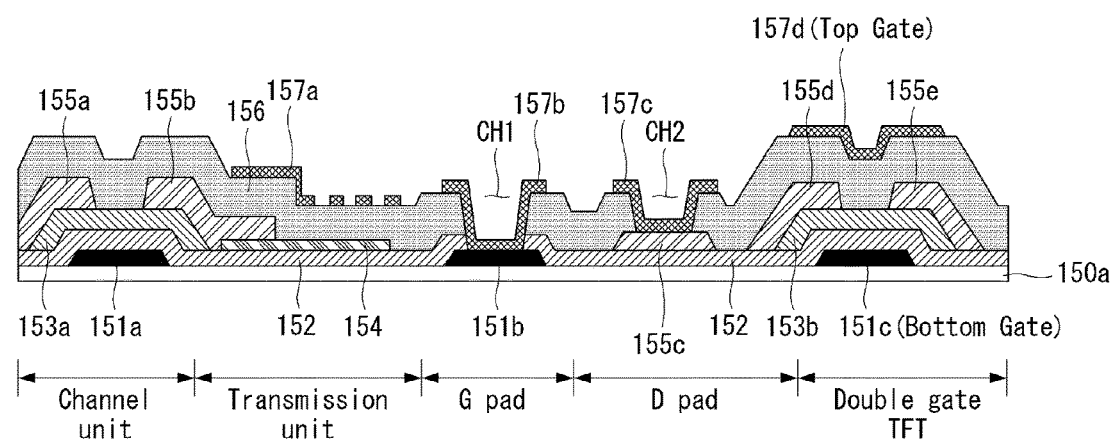

As shown in FIG. 22, a common electrode 157a is formed on the second insulating layer 156 positioned in the transmission unit defined on the substrate 150a. A G pad electrode 157b is formed on the second insulating layer 156 positioned in the G pad defined on the substrate 150a. A D pad electrode 157c is formed on the second insulating layer 156 positioned in the D pad defined on the substrate 150a. A compensation gate electrode 157d is formed on the second insulating layer 156 positioned in the double gate TFT defined on the substrate 150a.

After the common electrode 157a, the G pad electrode 157b, the D pad electrode 157c, and the compensation gate electrode 157d are formed of the same transparent metal oxide, they are patterned and separated. The transparent metal oxide may be selected among ITO (Indium Tin Oxide), IZO (Indium Zinc Oxide), ITZO (Indium Tin Zinc Oxide), ZnO (Zinc Oxide), IGZO (Indium Gallium Zinc Oxide), and graphene.

The common electrode 157a is connected to a common voltage line (not shown) formed on the substrate 150a. The G pad electrode 157b is connected to the scan line formed on the substrate 150a. The D pad electrode 157c is connected to the data line formed on the substrate 150a. The compensation gate electrode 157d is connected to a transmission line of the compensation voltage. According to the first embodiment of the invention, the compensation gate electrode 157d is connected to the control line (not shown) formed on the substrate 150a. According to the second embodiment of the invention, the compensation gate electrode 157d is connected to the first low potential power line (not shown) formed on the substrate 150a.

As described above, when the third gate electrode 151c and the compensation gate electrode 157d are dividedly formed based on the second semiconductor layer 153b, the transistor including the gate electrode receiving the signal or the voltage for activating the channel and the compensation gate electrode receiving the compensation voltage for recovering the threshold voltage may be formed.

The embodiment of the invention described that the compensation gate electrode 157d is formed of the transparent metal oxide for the convenience of the process (i.e., for the omission of the process and an additional mask), as an example. The embodiment of the invention is not limited thereto. For example, the compensation gate electrode 157d may be formed of metal. The embodiment of the invention described the bottom gate transistor as an example, but is not limited thereto. For example, a top gate transistor may be used. In this instance, a position of the compensation gate electrode 157d may be changed. The embodiment of the invention described that the transistor has a staggered structure, an example, but is not limited thereto. For example, transistors having various structures including a coplanar structure may be used.

The third embodiment of the invention forms the compensation gate electrode in the transistor and thus can prevent the bad drive of the scan driver resulting from the temperature, the environment, the driving time, etc. using the compensation gate electrode.

As described above so far, the embodiment of the invention provides the scan driver and the display device using the scan driver capable of securing the reliability from the degradation factors, such as the temperature, the bias voltage, and the stress time, generating changes in the threshold voltage of the thin film transistor.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel; and
    a scan driver for supplying a scan signal to the display panel including transistors formed in a non-display area of the display panel,
    wherein at least one of the transistors includes a gate electrode and a compensation gate electrode positioned corresponding to a semiconductor layer, and the semiconductor layer is interposed between the gate electrode and the compensation gate electrode,
    wherein the gate electrode is supplied by a voltage for activating a channel in the semiconductor layer; and the compensation gate electrode is supplied by a compensation voltage for recovering a threshold voltage of the transistor.

2. The display device of claim 1, wherein the voltage supplied to the gate electrode is different from the compensation voltage supplied to compensation gate electrode.

3. The display device of claim 1, wherein the transistor having the compensation gate electrode is connected to a low potential power line supplying a low potential power to the scan driver.

4. The display device of claim 3, wherein the compensation gate electrode is connected to a compensation line, to which the compensation voltage is transmitted.

5. The display device of claim 3, wherein the compensation gate electrode is connected to an additional potential power line transmitting a potential power lower than the low potential power.

6. The display device of claim 1, wherein the compensation voltage varies depending on at least one of a temperature, a bias voltage, and a driving time applied to the transistor having the compensation gate electrode.

7. The display device of claim 1, wherein the compensation voltage is a negative voltage.

8. The display device of claim 1, wherein the compensation voltage causes the threshold voltage of the transistor to be shifted in a positive direction or a negative direction.

9. The display device of claim 1, further comprising:
    a temperature sensor configured to sense changes in a temperature of the scan driver;
    a driving time sensor configured to sense changes in the driving time of the scan driver; and
    a compensation voltage output unit configured to optimally output the compensation voltage based on one or two of the sensing results transmitted from the temperature sensor and the driving time sensor.

10. The display device of claim 9, wherein the temperature sensor, the driving time sensor, and the compensation voltage output unit are integrated into one of an image supply unit, a timing controller, or a level shifter in the scan driver, or are implemented as a separate integrated circuit.

11. The display device of claim 9, wherein the compensation voltage output unit outputs the compensation voltage during a blank period, in which an image is not displayed.

12. The display device of claim 9, wherein the compensation voltage output unit outputs the compensation voltage through a compensation line connected to the compensation gate electrode.

13. The display device of claim 1, wherein the scan driver includes a plurality of stages, where a preceding stage is connected with a subsequent stage, and wherein each stage includes at least a shift register and a inverter.

14. The display device of claim 13, the compensation voltage is supplied to both the shift register and the inverter.

15. The display device of claim 1, wherein the scan driver includes a plurality of stages, where a preceding stage is connected with a subsequent stage and each state includes at least a shift register, and wherein the shift register in the preceding state outputs the scan signal and a carry signal controlling a subsequent stage.

16. The display device of claim 15, wherein the transistor having the compensation gate electrode is connected to a low potential power line supplying a low potential power to the scan driver, wherein the compensation gate electrode is connected to an additional potential power line transmitting a potential power lower than the low potential power, and wherein the voltage supplied by the additional potential power line is outputted as the carry signal.

* * * * *